United States Patent
Yamasaki

(10) Patent No.: US 7,858,480 B2
(45) Date of Patent: Dec. 28, 2010

(54) SEMICONDUCTOR DEVICE AND METHOD OF FABRICATING THE SAME

(75) Inventor: Hiroyuki Yamasaki, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 34 days.

(21) Appl. No.: 12/390,033

(22) Filed: Feb. 20, 2009

(65) Prior Publication Data

US 2009/0212372 A1 Aug. 27, 2009

(30) Foreign Application Priority Data

Feb. 21, 2008 (JP) ............................. 2008-040230

(51) Int. Cl.
*H01L 21/336* (2006.01)
(52) U.S. Cl. .................. 438/279; 438/619; 438/421; 257/369; 257/E21.632
(58) Field of Classification Search .................. None
See application file for complete search history.

(56) References Cited

U.S. PATENT DOCUMENTS

2003/0008492 A1* 1/2003 Jung et al. ................... 438/624
2005/0285202 A1* 12/2005 Huang et al. ................. 257/368
2007/0045674 A1 3/2007 Komoda
2007/0090395 A1 4/2007 Sebe et al.
2007/0117370 A1* 5/2007 Chen et al. ................... 438/618

FOREIGN PATENT DOCUMENTS

JP 2007-150238 6/2007

* cited by examiner

*Primary Examiner*—W. David Coleman
*Assistant Examiner*—Shaka Scarlett
(74) *Attorney, Agent, or Firm*—Finnegan, Henderson, Farabow, Garrett & Dunner, L.L.P.

(57) ABSTRACT

A semiconductor device according to one embodiment includes: a semiconductor substrate comprising an element isolation region; two gate electrodes formed in substantially parallel on the semiconductor substrate via respective gate insulating films; two channel regions each formed in regions of the semiconductor substrate under the two gate electrodes; a source/drain region formed in a region of the semiconductor substrate sandwiching the two channel regions; a first stress film formed so as to cover the semiconductor substrate and the two gate electrodes; and a second stress film formed in at least a portion of a void, the void being formed in a region between the two gate electrodes.

19 Claims, 29 Drawing Sheets

SEMICONDUCTOR DEVICE AND METHOD OF FABRICATING THE SAME

CROSS-REFERENCE TO RELATED APPLICATIONS

This application is based upon and claims the benefit of priority from prior Japanese Patent Application No. 2008-040230, filed on Feb. 21, 2008, the entire contents of which are incorporated herein by reference.

BACKGROUND

A conventional semiconductor device is known in which a stress film is formed so as to cover a gate electrode and a source/drain region of a transistor. The conventional semiconductor device is, for example, disclosed in JP-A-2007-150238.

According to such conventional semiconductor device described in JP-A-2007-150238, etc., it is possible to improve a driving force of a transistor by generating a stress in a channel region under a gate electrode by a stress film.

However, when a distance between adjacent gate electrodes is small, it is difficult to form a stress film in uniform thickness between the gate electrodes, and a void may be formed in an interlayer insulating film that is formed in the stress film between the gate electrodes or on the stress film. In such cases, according to the conventional semiconductor device described in JP-A-2007-150238, etc., there is a problem that a sufficient stress is not generated in a channel region due to presence of the void, and it is thereby not possible to effectively improve a driving force of the transistor.

BRIEF SUMMARY

A semiconductor device according to one embodiment includes: a semiconductor substrate comprising an element isolation region; two gate electrodes formed in substantially parallel on the semiconductor substrate via respective gate insulating films; two channel regions each formed in regions of the semiconductor substrate under the two gate electrodes; a source/drain region formed in a region of the semiconductor substrate sandwiching the two channel regions; a first stress film formed so as to cover the semiconductor substrate and the two gate electrodes; and a second stress film formed in at least a portion of a void, the void being formed in a region between the two gate electrodes.

A method of fabricating a semiconductor device according to another embodiment includes; forming two gate electrodes in substantially parallel on a semiconductor substrate via respective gate insulating films; forming a source/drain region in the semiconductor substrate on both sides of the two gate electrodes; forming a first stress film on the semiconductor substrate and the two gate electrodes; forming an interlayer insulating film on the first stress film; forming a contact hole in the first stress film and the interlayer insulating film on the source/drain region so as to penetrate through a void, the void being in the first stress film or the interlayer insulating film in a region between the two gate electrodes; and forming a second stress film in at least a portion of the void via the contact hole.

DETAILED DESCRIPTION

First Embodiment

Figure 1:
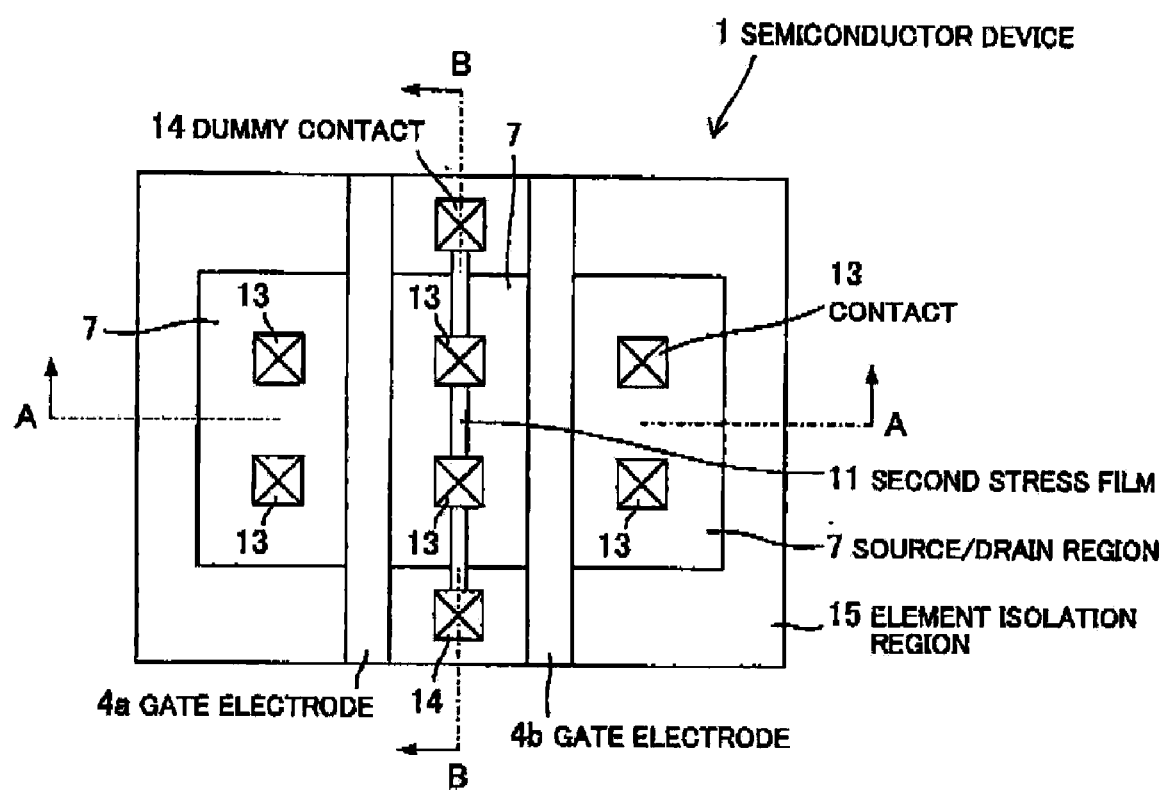
FIG. 1 is a top view showing an arrangement relation of main structural members of a semiconductor device according to a first embodiment.
Figure 2A:
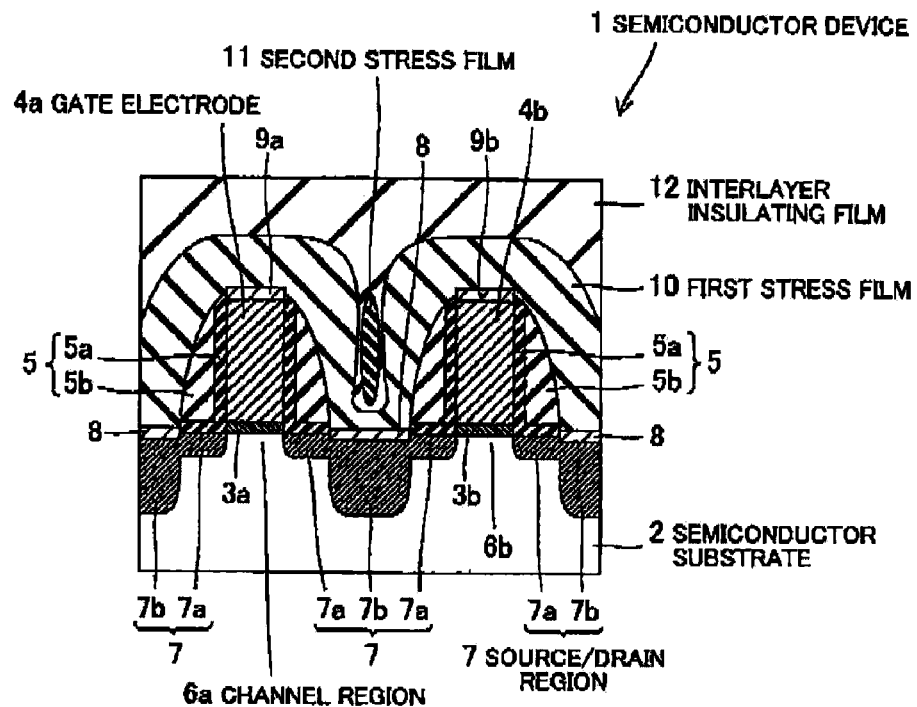
FIG. 2A is a cross sectional view when a cut surface of the semiconductor device taken on chain line A-A of FIG. 1 is viewed in a direction indicated by an arrow in the figure and FIG. 2B is a cross sectional view when a cut surface of the semiconductor device taken on chain line B-B of FIG. 1 is viewed in a direction indicated by an arrow in the figure.
Figure 2B:
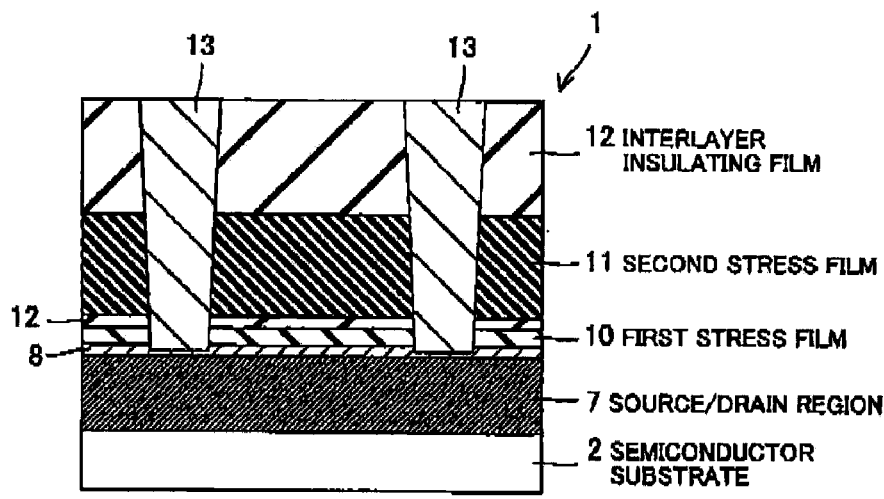

FIG. 1 is a top view showing an arrangement relation of main structural members of a semiconductor device according to a first embodiment. In addition, FIG. 2A is a cross sectional view when a cut surface of the semiconductor device taken on chain line A-A of FIG. 1 is viewed in a direction indicated by an arrow in the figure and FIG. 2B is a cross sectional view when a cut surface of the semiconductor device taken on chain line B-B of FIG. 1 is viewed in a direction indicated by an arrow in the figure.

A semiconductor device 1 has a semiconductor substrate 2, gate electrodes 4a and 4b formed in parallel on the semiconductor substrate 2 via gate insulating films 3a and 3b, gate sidewalls 5 formed on side faces of the gate electrodes 4a and 4b, channel regions 6a and 6b each formed in regions of the semiconductor substrate 2 under the gate electrodes 4a and 4b and having a crystal strain, a source/drain region 7 formed in a region of the semiconductor substrate 2 sandwiching the channel regions 6a and 6b, a silicide layer 8 formed on the source/drain region 7, gate silicide layers 9a and 9b each formed on the gate electrodes 4a and 4b, a first stress film 10 formed on the semiconductor substrate 2, the gate electrodes 4a, 4b and the gate sidewalls 5 for generating a crystal strain in the channel regions 6a and 6b, an interlayer insulating film 12 formed on the first stress film 10 and having a void in a region between the gate electrodes 4a and 4b, and a second stress film 11 formed in at least a portion of the void for generating a crystal strain in the channel regions 6a and 6b. Note that, an element region in which the above-mentioned each member on the semiconductor substrate 2 is formed is electrically isolated from peripheral regions by an element isolation region 15. In addition the source/drain region 7 is connected to upper wirings, etc., (not shown) by contacts 13.

For the semiconductor substrate 2, it is possible to use a Si substrate of which principal surface is, e.g., a {100} plane. The {100} plane represents a (100) plane and a plane equivalent to the (100) plane.

The element isolation region 15 is made of, e.g., an insulating material such as $SiO_2$, etc., and has a STI (Shallow Trench Isolation) structure.

The gate insulating films 3a and 3b are made of, e.g., SiO, SiN, SiON, or a high-dielectric material (e.g., an Hf-based material such as HfSiON, HfSiO or HfO, etc., a Zr-based material such as ZrSiON, ZrSiO or ZrO, etc., and a Y-based material such as $Y_2O_3$, etc.).

The gate electrodes 4a and 4b are made of a Si-based polycrystalline such as polycrystalline Si or polycrystalline SiGe, etc., containing a conductivity type impurity. An n-type impurity such as As or P, etc., is used for composing an n-type transistor, and a p-type impurity such as B or $BF_2$, etc., is used for composing a p-type transistor. Alternatively, the gate electrodes 4a and 4b may be a metal gate electrode made of W, Ta, Ti, Hf, Zr, Ru, Pt, Ir, Mo or Al, etc., or a compound thereof. In this case, the gate silicide layers 9a and 9b are not formed. Furthermore, the gate electrodes 4a and 4b may have a structure in which a metal gate electrode and a Si-based polycrystalline electrode are laminated.

The gate sidewall 5 has a structure of two layers including a first layer 5a made of NSG (non-doped silicate glass), etc., and a second layer 5b made of a Si nitride film, etc. Note that, materials of the first layer 5a and the second layer 5b may be reversed. Furthermore, the gate sidewall 5 may have a single layer structure or a structure of three or more layers.

For example, when a plane direction of the principal surface of the semiconductor substrate 2 is {100}, the channel regions 6a and 6b are formed so that a channel direction is <110> or <100>. Note that, a <110> axial direction represents a [110] axial direction and an axial direction equivalent to [110] axial direction, and a <100> axial direction represents a [100] axial direction and an axial direction equivalent to [100] axial direction.

In case that a channel direction is <110>, as for the n-type transistor, carrier (electron) mobility inside the channel regions 6a and 6b is improved when a tensile strain in a channel direction or a channel width direction is generated therein. Meanwhile, as for the p-type transistor, carrier (hole) mobility inside the channel regions 6a and 6b is improved when a compressive strain in a channel direction or a tensile strain in a channel width direction is generated.

In case that a channel direction is <100>, as for the n-type transistor, carrier (electron) mobility inside the channel regions 6a and 6b is improved when a tensile strain in a channel direction or a channel width direction is generated therein. Meanwhile, as for the p-type transistor, carrier (hole) mobility inside the channel regions 6a and 6b is improved when a compressive strain in a channel direction or a channel width direction is generated.

The source/drain region 7 includes a shallow extension region 7a and a deep region 7b, and is formed by implanting a conductivity type impurity into the semiconductor substrate 2. As for the conductivity type impurity contained in the source/drain region 7, an n-type impurity such as As or P, etc., is used for composing the n-type transistor and a p-type impurity such as B or $BF_2$, etc., is used for composing the p-type transistor.

The silicide layer 8 is made of a metal such as Ni, Pt, Co, Er, Y, Yb, Ti, Pd, NiPt or CoNi, etc, with a compound containing Si, and is formed on an exposed portion of an upper surface of the source/drain region 7.

The gate silicide layers 9a and 9b are made of the same material as the silicide layer 8, and are each formed on the gate electrodes 4a and 4b.

The first stress film 10 is made of a Si nitride film, etc., formed by a plasma CVD (Chemical Vapor Deposition) method, etc., so as to include a stress. Since the first stress film 10 includes a stress, it is possible to generate a strain in peripheral members. In this case, a compressive stress or a tensile stress in a channel direction can be generated in the channel regions 6a and 6b by controlling an operating condition of a plasma CVD apparatus, thereby forming the first stress film 10 so as to include a stress for generating a compressive strain or a tensile strain in peripheral members. For example, a hydrogen concentration in the Si nitride film is controlled by appropriately setting RF (Radio Frequency) power, etc., of the plasma CVD apparatus, and it is thereby possible to separately form a tensile stress film (for the n-type transistor) and a compressive stress film (for the p-type transistor). In detail, it is possible to form the tensile stress film by decreasing volume density by lowering the hydrogen concentration, and to form the compressive stress film by increasing the volume density by raising the hydrogen concentration.

In addition, in case that the first stress film 10 is formed as a tensile stress film, it is preferable to form the first stress film 10 so as to have film properties such that, e.g., a tensile stress of about 1.7 GPa is generated in a region in the vicinity of a surface of a Si substrate when the first stress film 10 is formed on the Si substrate having a flat surface.

Here, compared with other film formation methods such as LPCVD (Low Pressure CVD), etc., the plasma CVD method is characterized in that coatability of the film is inferior. Therefore, when a distance between the gate electrodes 4a and 4b is smaller than, e.g., about 110 m (a width of the gate sidewall is assumed to be about 25 nm), thickness of the first stress film 10 becomes uneven in a region between the gate electrodes 4a and 4b, the interlayer insulating film 12 is not completely embedded in the region between the gate electrodes 4a and 4b, and thus, a void is likely to be formed, Note that, for example, when the distance between the gate electrodes 4a and 4b is about 110 m and the width of the gate sidewall is about 25 nm, first stress film 10 is preferably about 60 nm in thickness. In addition, as shown in FIG. 2A, when the source/drain region 7 between the gate electrodes 4a and 4b is shared by transistors each composed of the gate electrodes 4a and 4b, the distance between the gate electrodes 4a and 4b is relatively narrow and a void is thus likely to be formed in the interlayer insulating film 12.

The interlayer insulating film 12 has a void in the region between the gate electrodes 4a and 4b. For example, when a NSG film is formed as the interlayer insulating film 12 by the CVD method using $O^3$ and TEOS (Tetraethoxysilane), since the coatability is deteriorated, it is possible to relatively easily form the interlayer insulating film 12 including a void.

The second stress film 11 is made of a Si nitride film, etc., formed by the LPCVD method, etc., with relatively good film coatability so as to generate a stress in the peripheral members. When the LPCVD method is used, the second stress film 11 made of Si nitride is formed as a tensile stress film including a stress for generating a tensile stress in a channel direction in the channel regions 6a and 6b, and it is possible to improve the carrier mobility in the channel regions 6a and 6b when the channel regions 6a and 6b are channel regions in the n-type transistor. In addition, the second stress film 11 is formed in at least a portion of the void that is generated in a region between the gate electrodes 4a and 4b in the interlayer insulating film 12.

In addition, in case that the second stress film 11 is formed as a tensile stress film, it is preferable to form the second stress film 11 so as to have film properties such that, e.g., a tensile stress of about 1.2 GPa is generated in a region in the vicinity of the surface of the Si substrate when the second stress film 11 is formed on the Si substrate having a flat surface.

The contact 13 is made of, e.g., a metal such as Cu, Al, Au, Ag or W, etc. In addition, contact holes for forming the contacts 13 formed between the gate electrodes 4a and 4b are formed so as to penetrate through the void in the interlayer insulating film 12, and are used when forming the second stress film 11 in the void. In addition, dummy contacts 14 which are formed on the element isolation region 15 so as to penetrate through the void in the interlayer insulating film 12 are formed in order to effectively form the second stress film 11 in the void in the interlayer insulating film 12, and do not have a function of electrically connecting upper and lower members.

An example of a method of fabricating a semiconductor device 1 according to the present embodiment will be described hereinafter.

FIGS. 3A, 4A, 5A, 6A, 7A and 8A are cross sectional views showing processes for fabricating the semiconductor device according to the first embodiment, and the cross sections thereof correspond to the cross section shown in FIG. 2A. Furthermore, FIGS. 3B, 4B, 5S, 6B, 7B and 8B are cross sectional views showing processes for fabricating the semiconductor device according to the first embodiment, and the cross sections thereof correspond to the cross section shown in FIG. 2B.

Figure 3A:
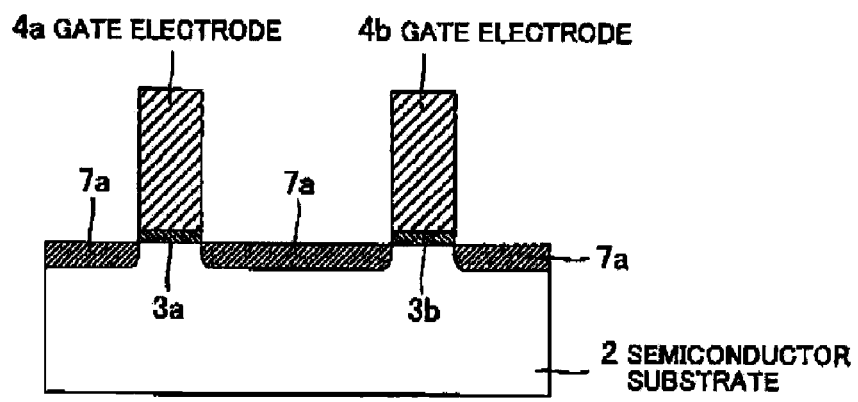
FIGS. 3A and 3B are cross sectional views showing processes for fabricating the semiconductor device according to the first embodiment.
Figure 3B:
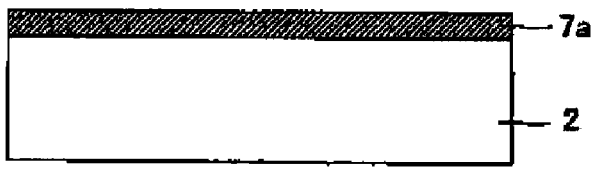

Firstly, as shown in FIGS. 3A and 3B, the gate electrodes 4a and 4b are each formed on the semiconductor substrate 2, having the element isolation region 15 (not shown) formed therein, via the gate insulating films 3a and 3b, and a conductivity type impurity is implanted into the semiconductor substrate 2 by an ion implantation procedure, etc., using the gate electrodes 4a and 4b as a mask, which results in that the extension region 7a of the source/drain region 7 is formed.

Figure 4A:
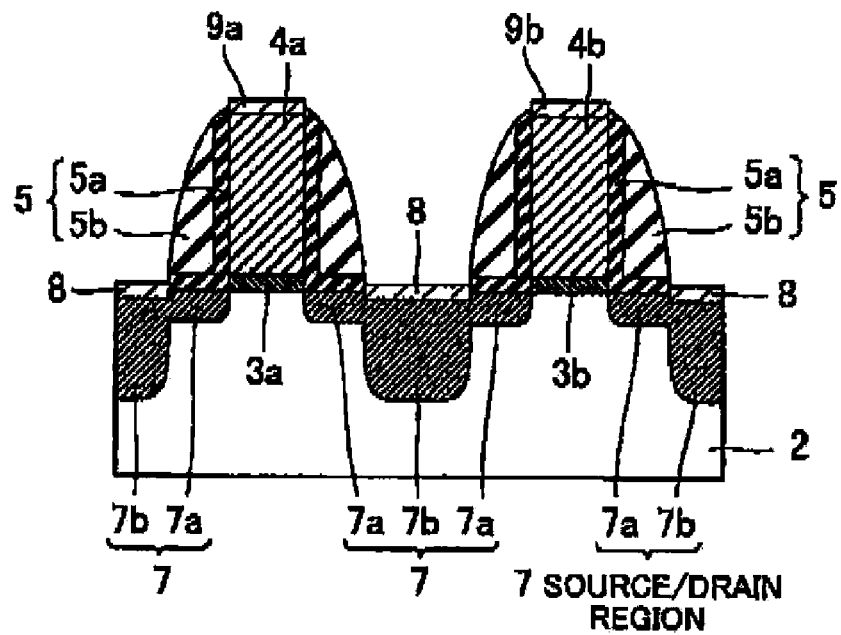
FIGS. 4A and 4B are cross sectional views showing processes for fabricating the semiconductor device according to the first embodiment.
Figure 4B:
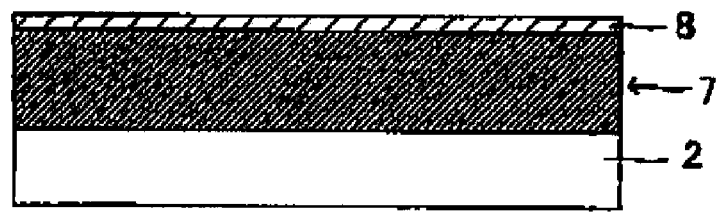

Next, as shown in FIGS. 4A and 4B, the gate sidewalls 5, the deep region 7b of the source/drain region 7, the silicide layer 8 and the gate silicide layers 9a and 9b are formed. Here, the deep region 7b is formed by implanting a conductivity type impurity into the semiconductor substrate 2 by the ion implantation procedure, etc., using the gate electrodes 4a, 4b and the gate sidewalls 5 as a mask. A metal film made of Ni, etc., is formed by sputtering, etc., so as to cover the exposed portions of the upper surfaces of the gate electrodes 4a, 4b and the source/drain region 7, and silicidation reaction is generated on an interface between the metal film and the gate electrodes 4a and 4b as well as on an interface between the metal film and the source/drain region 7 by applying heat treatment, which results in that the silicide layer 8 and the gate silicide layers 9a and 9b are formed.

Figure 5A:
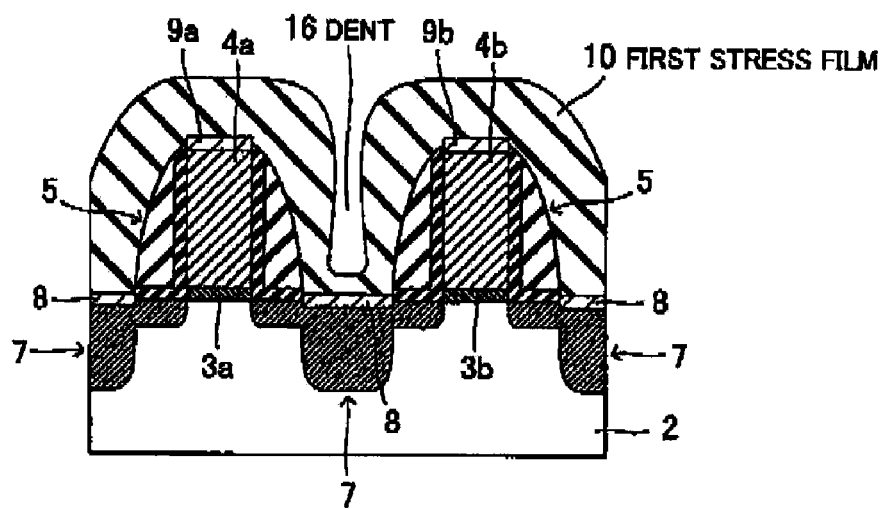
FIGS. 5A and 5B are cross sectional views showing processes for fabricating the semiconductor device according to the first embodiment.
Figure 5B:
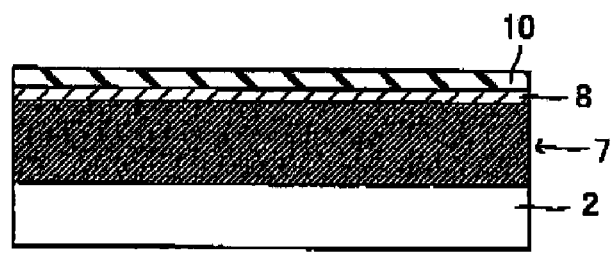

Next, as shown in FIGS. 5A and 5B, the first stress film 10 is formed so as to cover the whole surface of the semiconductor substrate 2 by the plasma CVD method, etc., using $SiH_4$ and $NH_3$ as a source gas. At this time, a portion of the first stress film 10 located between the gate electrodes 4a and 4b becomes uneven in thickness due to the distance between the gate electrodes 4a and 4b (the distance between the gate sidewalls 5 facing each other) or the coatability of the first stress film 10, etc., and a narrow dent 16 is thus formed. As shown in FIG. 5A, the dent 16 is in a shape that, e.g., the entrance is narrower than the inner space.

Figure 6A:
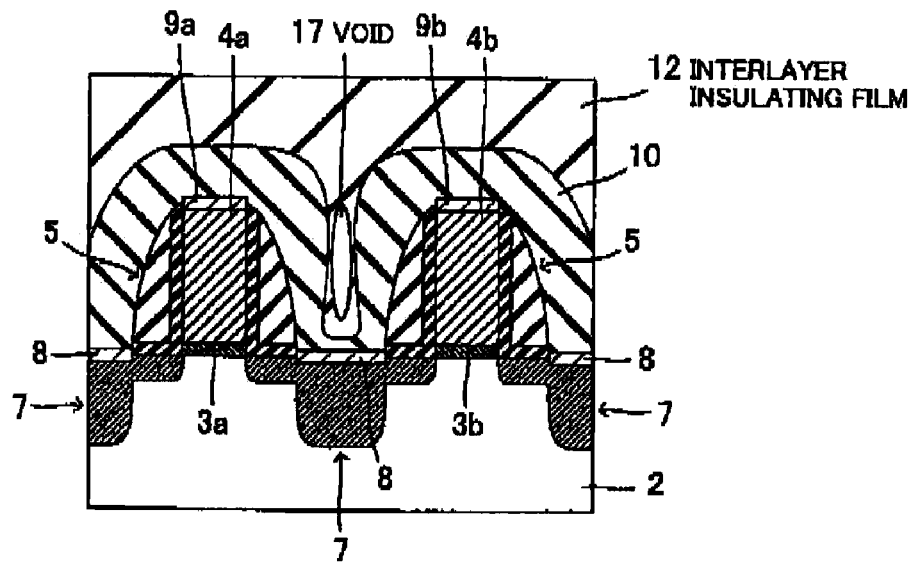
FIGS. 6A and 6B are cross sectional views showing processes for fabricating the semiconductor device according to the first embodiment.
Figure 6B:
Figure 6B:
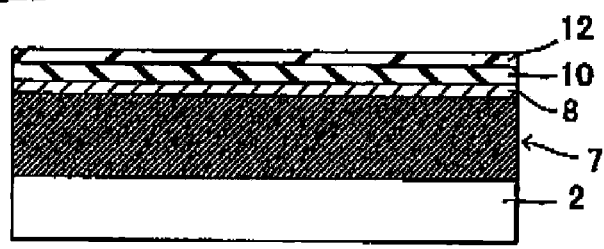

Next, as shown in FIGS. 6A and 6B, the interlayer insulating film 12 is formed on the first stress film 10 by the CVD method, etc. At this time, the interlayer insulating film 12 is not completely embedded in the dent 16 due to the shape and size of the dent 16 or the coatability of the interlayer insulating film 12, etc., and a void 17 is thus formed.

Figure 7A:
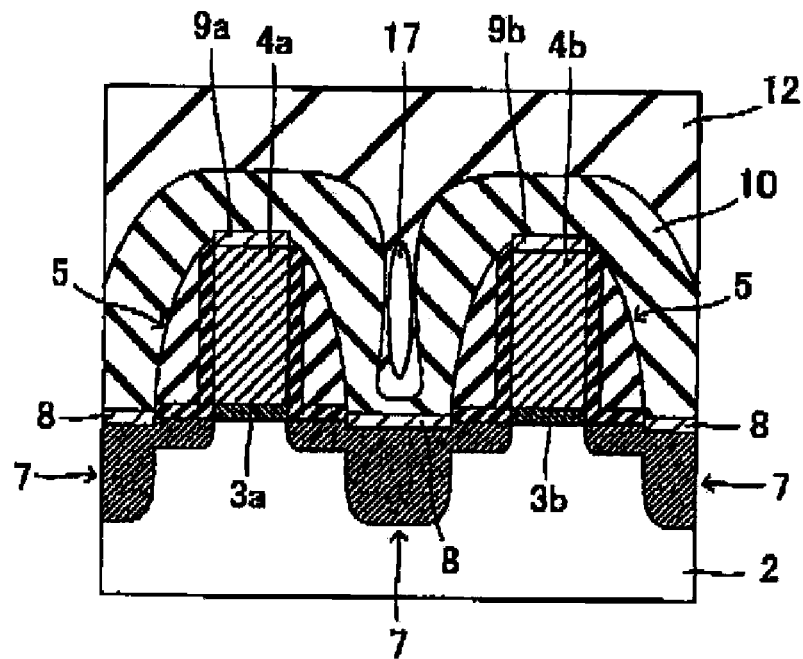
FIGS. 7A and 7B are cross sectional views showing processes for fabricating the semiconductor device according to the first embodiment.
Figure 7B:
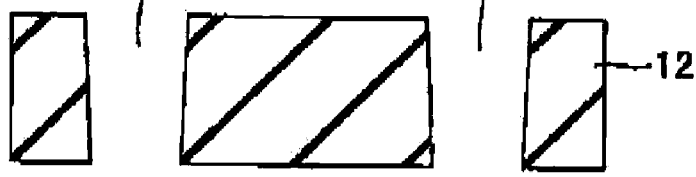
Figure 7B:
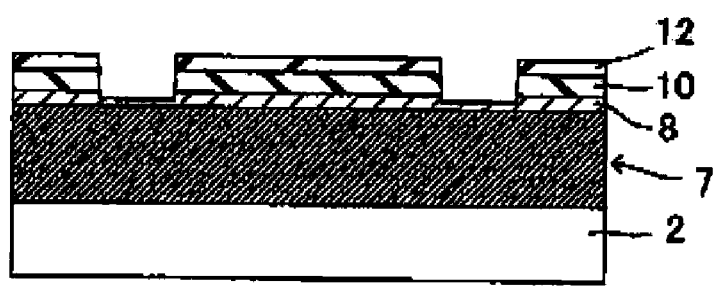

Next, as shown in FIGS. 7A and 7B, contact holes 18 for forming the contacts 13 and the dummy contacts 14 are formed in the interlayer insulating film 12 so as to penetrate through the void 17.

Figure 8A:
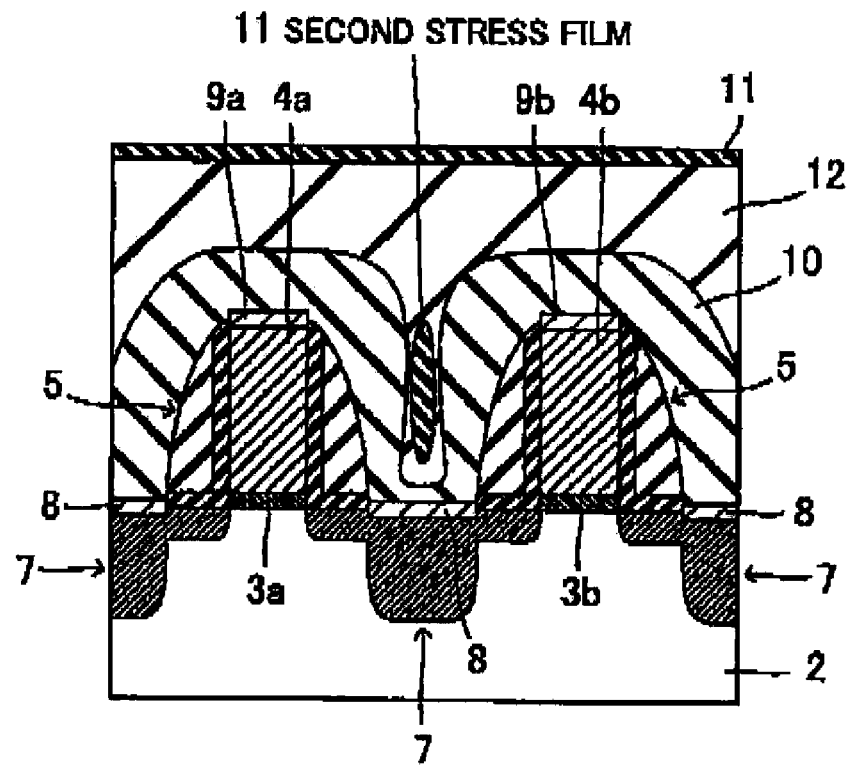
FIGS. 8A and 8B are cross sectional views showing processes for fabricating the semiconductor device according to the first embodiment.
Figure 8B:
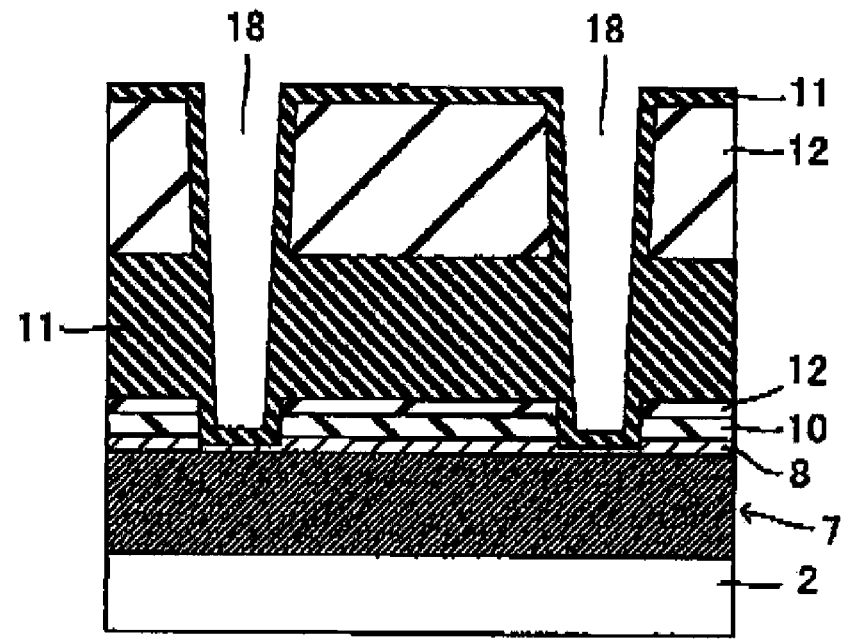

Next, as shown in FIGS. 8A and 8B, the second stress film 11 is formed in the void 17 through the contact hole 18. At this time, it is preferable that the second stress film 11 fills as much region of the void 17 as possible. Note that, the second stress film 11 is formed by, e.g., reacting $Si_2Cl_6$ with $NH_3$, which are source gases, under reduced pressure of 0.1-10 Torr by the LPCVD method.

Next, after the second stress film 11 on the interlayer insulating film 12 and on the bottom surface as well as the inner side surface of the contact holes 18 is removed by etching, the contacts 13 and the dummy contacts 14 are formed by embedding a metal material into the contact holes 18, thereby obtaining the semiconductor device 1 shown in FIGS. 2A and 2B. Note that, although the second stress film 11 on the inner side surface of the contact holes 18 may be left without being removed, the second stress film 11 is preferable to be removed in order to suppress increase of parasitic capacitance between an upper wiring (not shown) and the semiconductor substrate 2 as well as in order to increase a diameter of the contact 13.

According to the first embodiment, by forming the second stress film 11 in the void 17 that is formed in the interlayer insulating film 12, it is possible to suppress that a strain generated in the channel regions 6a and 6b by the first stress film 10 is decreased due to the presence of the void 17.

Furthermore, since the second stress film 11 has a function of generating a strain in the channel regions 6a and 6b, it is possible to improve the carrier mobility by effectively generating a strain in the channel regions 6a and 6b of the semiconductor device 1.

Note that, in general, since the coatability of the compressive stress film is inferior to that of the tensile stress film, when the compressive stress film is formed as the first stress film 10, the second stress film 11 is formed more easily. It is because, if the coatability of the first stress film 10 is inferior, the dent 16 having a shape difficult to embed the interlayer insulating film 12 is formed, and thus, the void 17 is likely to be formed.

In addition, it is also possible to apply the present embodiment to a semiconductor device in which the n-type and p-type transistors are mounted together. In this case, the first stress film 10 is preferably formed as a tensile stress film in the n-type transistor region and as a compressive stress film in the p-type transistor region. Meanwhile, the second stress film 11 is formed as, e.g., a tensile stress film in both n-type and p-type transistors.

Second Embodiment

In the second embodiment, the first embodiment is applied to SRAM. Note that, the explanation will be omitted for the points same as the first embodiment.

Figure 9:
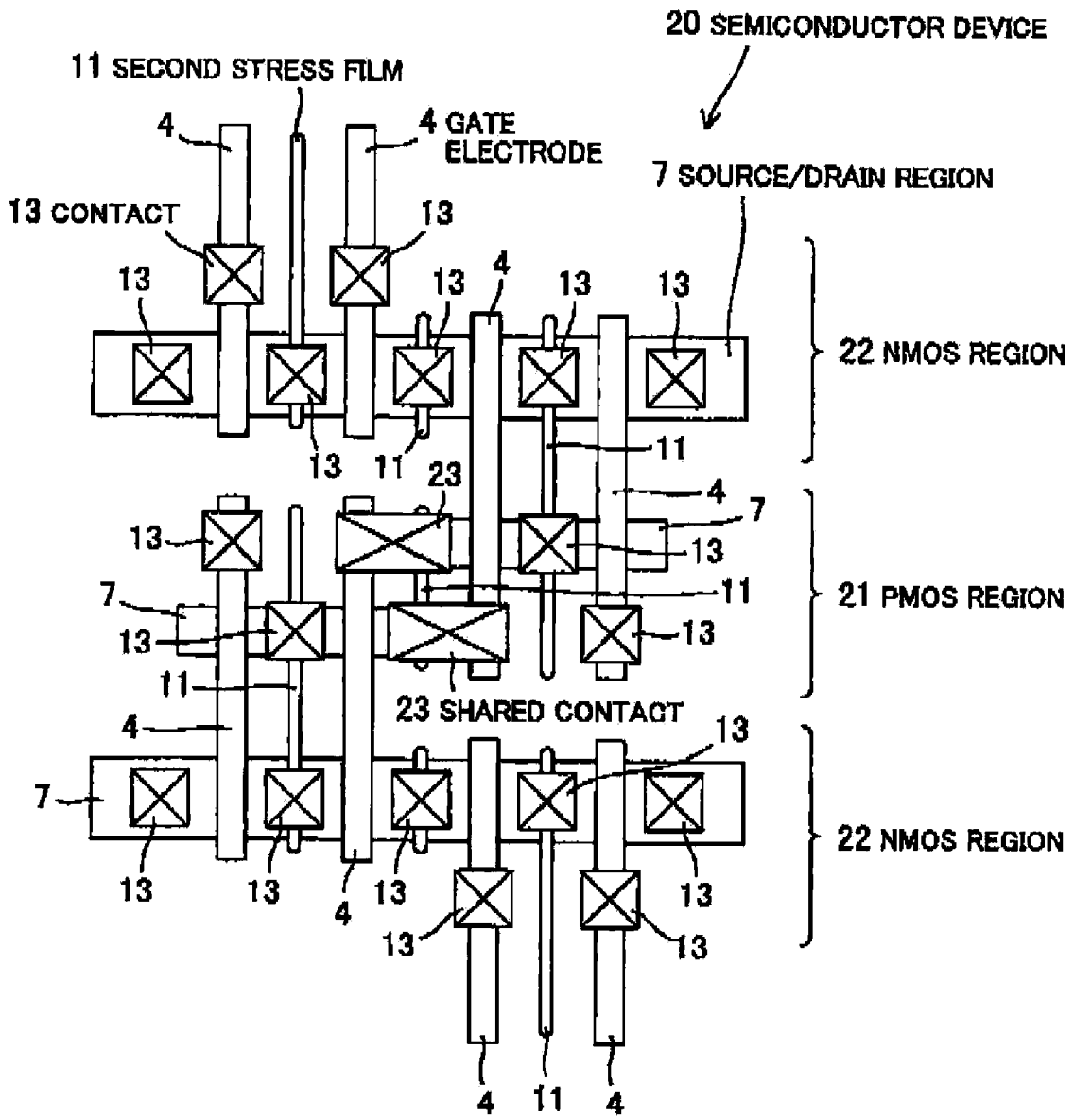
FIG. 9 is a top view showing an arrangement relation of main structural members of a semiconductor device according to a second embodiment.

FIG. 9 is a top view showing an arrangement relation of main structural members of a semiconductor device according to a second embodiment.

A semiconductor device 20 has a SRAM structure, and a PMOS region 21 and NMOS regions 22 on both sides of the PMOS region 21 are included. A structure of each portion is same as the first embodiment, and a first stress film (not shown) and the second stress film 11 are formed as a tensile stress film. The second stress film 11 is formed in a void that is formed in a region between adjacent gate electrodes 4 in an interlayer insulating film (not shown). The first stress film may be separately formed as a compressive stress film in the PMOS region 21 and as a tensile stress film in the NMOS region 22 by a lithography method, etc.

In addition, the PMOS region 21 has a shared contact 23 commonly formed in a predetermined gate electrode 4 and a source/drain region 7. The shared contact 23 has a function of connecting the gate electrode 4 and the source/drain region 7 with upper wirings (not shown), etc. Similarly to the contact 13 in the first embodiment, a contact hole for forming the shared contact 23 is formed penetrating through a void in an interlayer insulating film, and can be used for forming the second stress film 11 in the void.

Third Embodiment

The third embodiment is different from the first embodiment in a formation method of a second stress film, etc. Note that, the explanation will be omitted for the points same as the first embodiment.

Figure 10A:
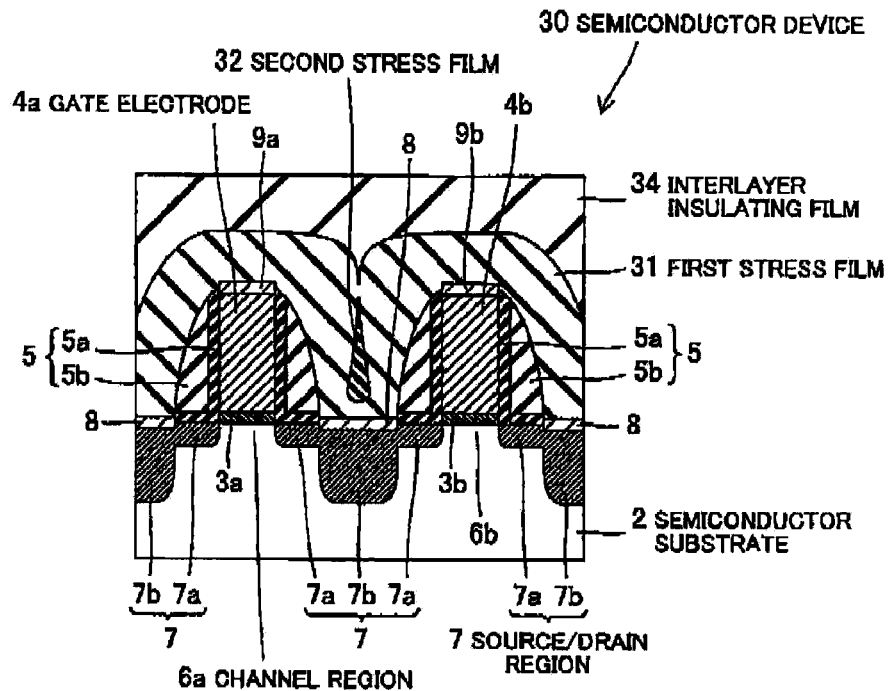
FIGS. 10A and 10B are Cross sectional views showing a semiconductor device according to a third embodiment.
Figure 10B:
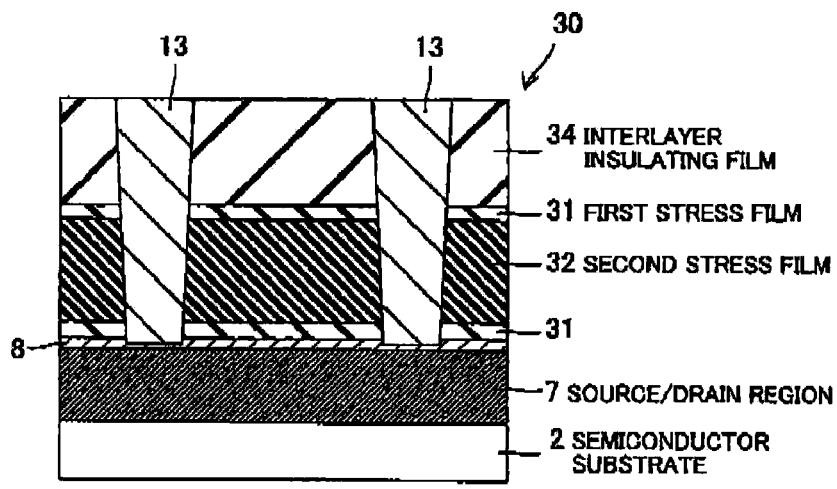

FIGS. 10A and 10B are cross sectional views showing a semiconductor device according to a third embodiment. Note that, the cross sections shown in FIGS. 10A and 10B each correspond to the cross sections shown in FIGS. 2A and 2B in the first embodiment.

In a semiconductor device 30 according to the present embodiment, a second stress film 32 is formed in at least a portion of a void that is formed in a first stress film 31. Note that, the materials and functions of the first stress film 31 and the second stress film 32 are same as those in the first embodiment, which is to generate a crystal strain in the channel regions 6a and 6b.

An example of a method of fabricating a semiconductor device 30 according to the present embodiment will be described hereinafter.

Figure 11A:
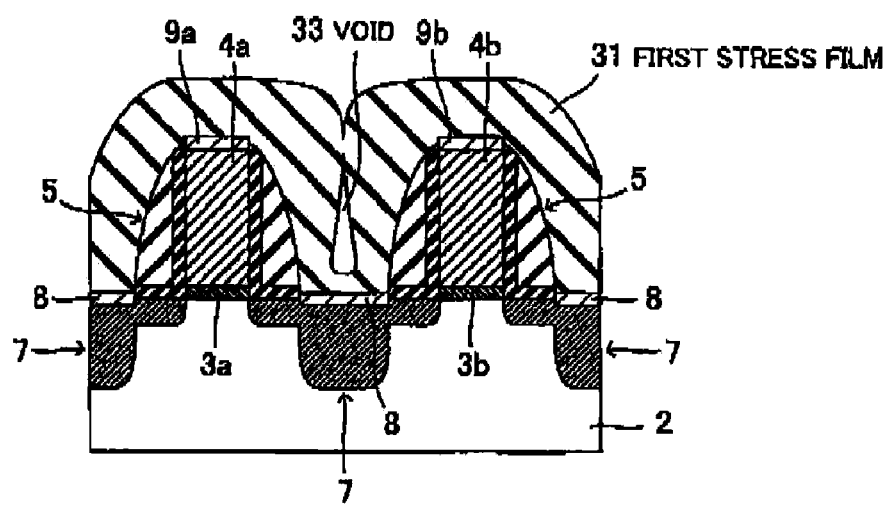
FIGS. 11A and 11B are cross sectional views showing processes for fabricating the semiconductor device according to the third embodiment.
Figure 11B:
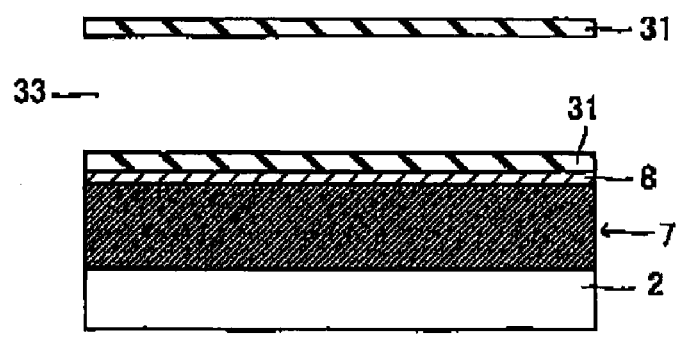
Figure 12A:
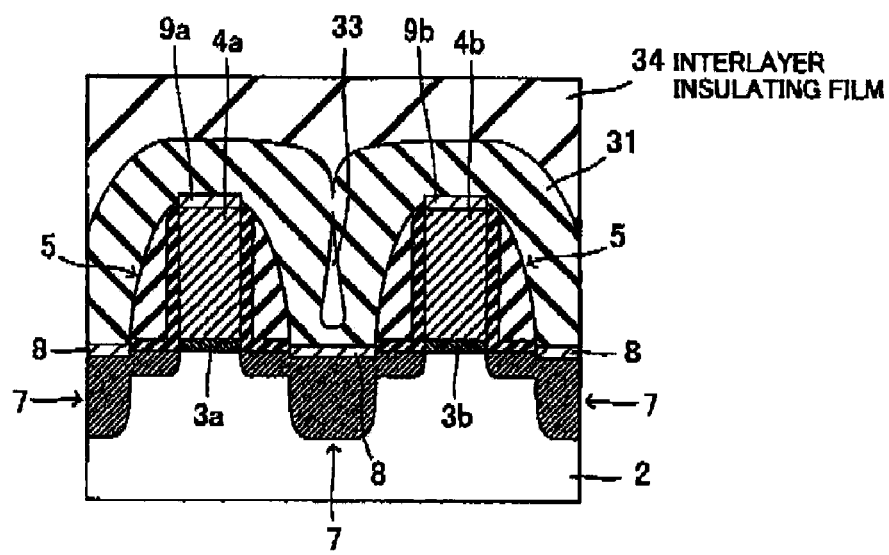
FIGS. 12A and 12B are cross sectional views showing processes for fabricating the semiconductor device according to the third embodiment.
Figure 12B:
Figure 12B:
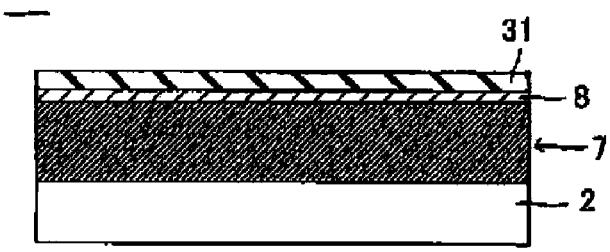
Figure 13A:
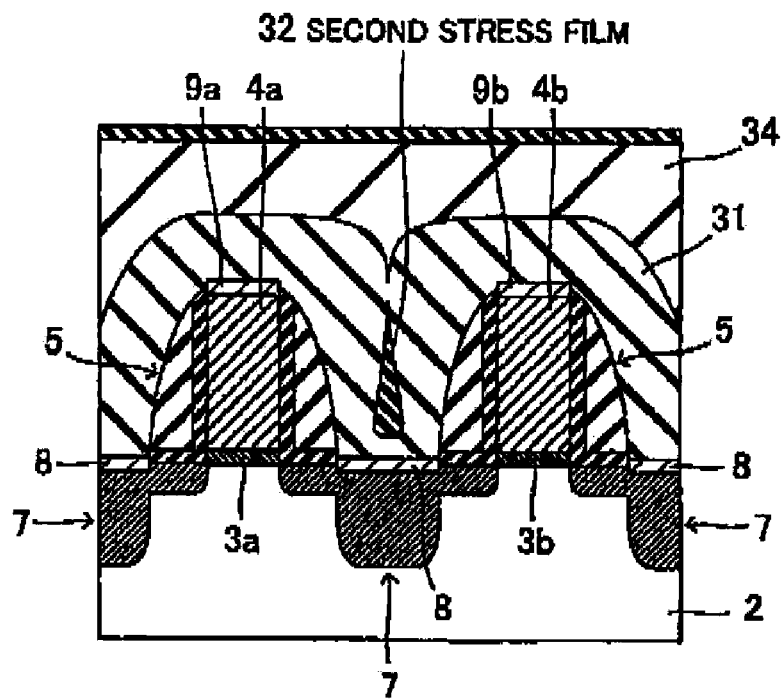
FIGS. 13A and 13B are cross sectional views showing processes for fabricating the semiconductor device according to the third embodiment.
Figure 13B:
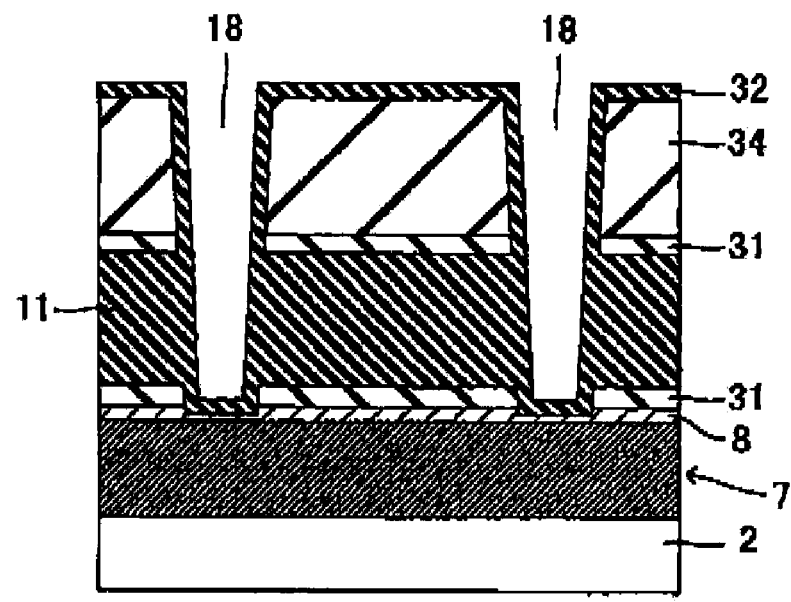

FIGS. 11A, 12A and 13A are cross sectional views showing processes for fabricating the semiconductor device according to the third embodiment, and the cross sections thereof correspond to the cross section shown in FIG. 2A in the first embodiment. Furthermore, FIGS. 11B, 12B and 13B are cross sectional views showing processes for fabricating the semiconductor device according to the third embodiment, and the cross sections thereof correspond to the cross section shown in FIG. 2B in the first embodiment.

Firstly, the processes until the process, shown in FIGS. 4A and 4B, for forming the gate silicide layers 9a and 9b are carried out in the same way as the first embodiment.

Next, as shown in FIGS. 11A and 11B, the first stress film 31 is formed so as to cover the whole surface of the semiconductor substrate 2 by the plasma CVD method, etc., using $SiH_4$ and $NH_3$ as a source gas. At this time, a portion of the first stress film 31 located between the gate electrodes 4a and 4b becomes uneven in thickness due to the distance between the gate electrodes 4a and 4b (the distance between the gate sidewalls 5 facing each other) or the coatability of the first stress film 31, etc., and a void 33 is thus formed. The upper portion of the void 33 is blocked off by the first stress film 31.

Next, as shown in FIGS. 12A and 12B, an interlayer insulating film 34 is formed on the first stress film 31 by the CVD method, etc. At this time, since the void 33 is sealed off by the first stress film 31, the interlayer insulating film 34 is not formed in the void 33.

Next, as shown in FIGS. 13A and 13B, contact holes 18 for forming the contacts 13 and dummy contacts (not shown) are formed in the interlayer insulating film 34 so as to penetrate through the void 33, and the second stress film 32 is formed in the void 33 through the contact holes 18. At this time, it is preferable that the second stress film 32 fills as much region of the void 33 as possible.

Next, after the second stress film 32 on the interlayer insulating film 34 and on the bottom surface as well as the inner side surface of the contact holes 18 is removed by etching, the contacts 13 and the dummy contacts (not shown) are formed by embedding a metal material into the contact holes 18, thereby obtaining the semiconductor device 1 shown in FIGS. 10A and 10B. Note that, although the second stress film 32 on the inner side surface of the contact holes 19 may be left without being removed, the second stress film 32 is preferable to be removed in order to suppress increase of parasitic capacitance between an upper wiring (not shown) and the semiconductor substrate 2 as well as in order to increase a diameter of the contact 13.

According to the third embodiment, the second stress film 32 is formed by a method different from the method of forming the second stress film 11 in the first embodiment, and it is possible to obtain the same effect as the first embodiment. In addition, since it is not necessary to form a void in the interlayer insulating film 34, a method which deteriorates the coatability does not particularly need to be used for forming the interlayer insulating film 34.

Note that, a structure having the second stress film 11 of the semiconductor device 1 in the first embodiment and a structure having the second stress film 32 of the semiconductor device 30 in the present embodiment may exist together in one semiconductor device.

Fourth Embodiment

The fourth embodiment is different from the first embodiment in a shape of a second stress film, etc. Note that, the explanation will be omitted for the points same as the first embodiment.

Figure 14:
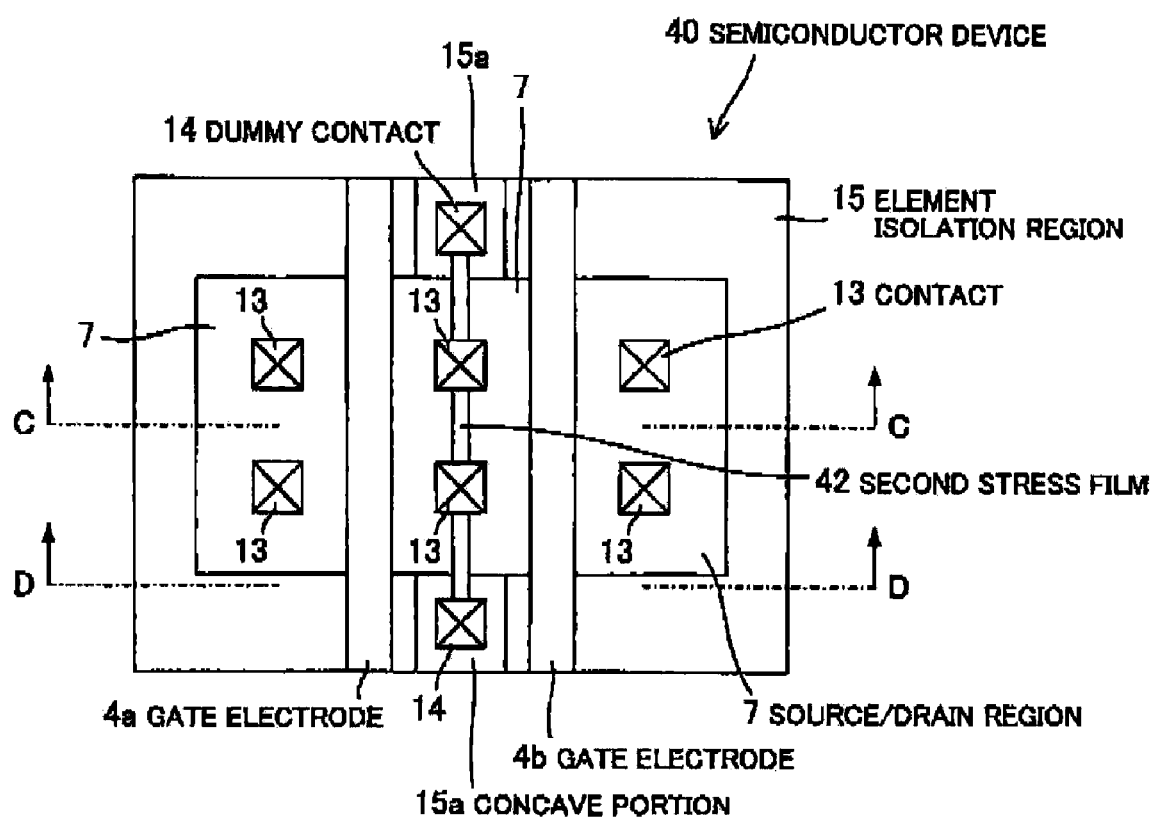
FIG. 14 is a top view showing an arrangement relation of main structural members of a semiconductor device according to a fourth embodiment.

FIG. 14 is a top view showing an arrangement relation of main structural members of a semiconductor device according to a fourth embodiment. In addition, FIG. 15A is a cross sectional view when a cut surface of the semiconductor device taken on chain line C-C of FIG. 14 is viewed in a direction indicated by an arrow in the figure and FIG. 15B is a cross sectional view when a cut surface of the semiconductor device taken on chain line D-D of FIG. 14 is viewed in a direction indicated by an arrow in the figure.

In a semiconductor device 40 according to the present embodiment, a concave portion 15a is formed in a region of the element isolation region 15 between the gate electrodes 4a and 4b (between the gate sidewalls 5 facing each other). Therefore, a region occupied by a second stress film 42 is increased (a cross-sectional area in the cross section of FIG. 15B is increased) in a region above the concave portion 15a. Note that, the materials and functions of the first stress film 41 and the second stress film 42 are same as those in the first embodiment, which is to generate a crystal strain in the channel regions 6a and 6b.

Figure 15A:
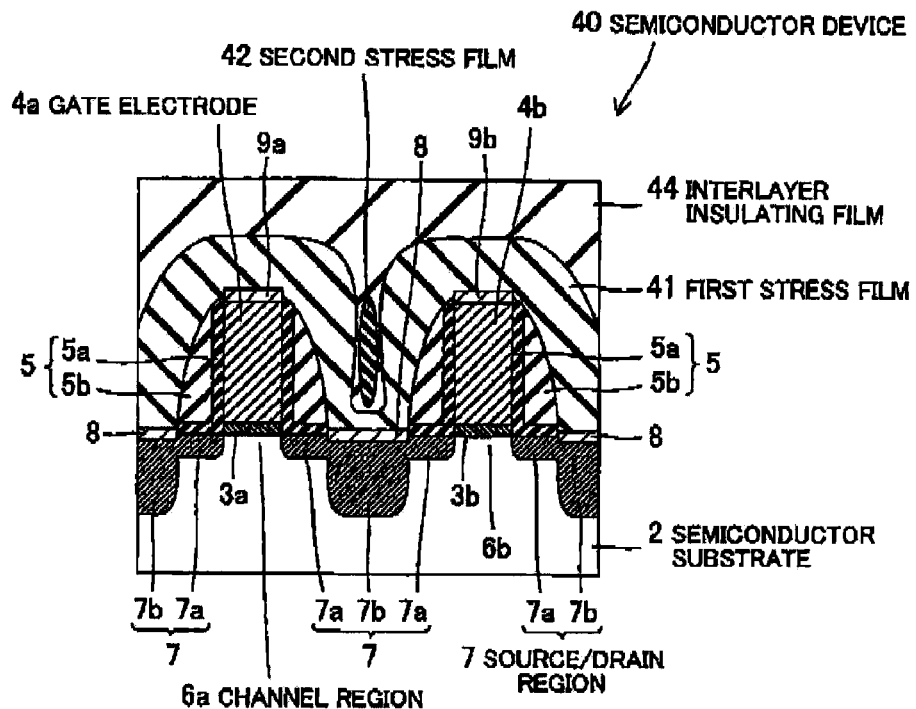
FIG. 15A is a cross sectional view when a cut surface of the semiconductor device taken on chain line C-C of FIG. 14 is viewed in a direction indicated by an arrow in the figure and FIG. 15B is a cross sectional view when a cut surface of the semiconductor device taken on chain line D-D of FIG. 14 is viewed in a direction indicated by an arrow in the figure.
Figure 15B:
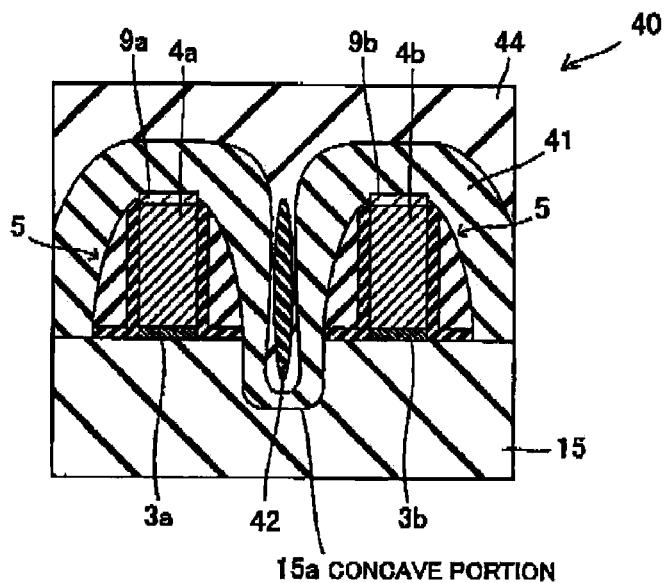

Note that, in a region above the source/drain region 7, a structure of the second stress film 42 and other members is same as the structure of the second stress film 11 and the other members in the first embodiment, and the cross section of FIG. 15A is substantially equal to that of FIG. 2A.

An example of a method of fabricating a semiconductor device 40 according to the present embodiment will be described hereinafter.

FIGS. 16A, 17A, 11A and 19A are cross sectional views showing processes for fabricating the semiconductor device according to the fourth embodiment, and the cross sections thereof correspond to the cross section shown in FIG. 15A. Furthermore, FIGS. 16B, 17B, 18B and 19B are cross sectional views showing processes for fabricating the semiconductor device according to the fourth embodiment, and the cross sections thereof correspond to the cross section shown in FIG. 15B.

Figure 16A:
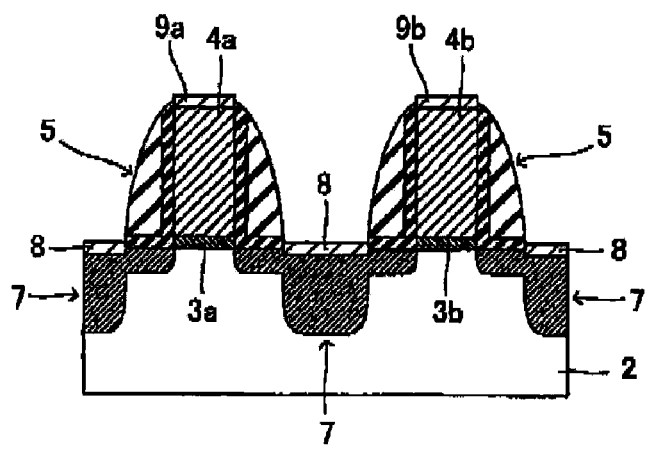
FIGS. 16A and 16B are cross sectional views showing processes for fabricating the semiconductor device according to the fourth embodiment.
Figure 16B:
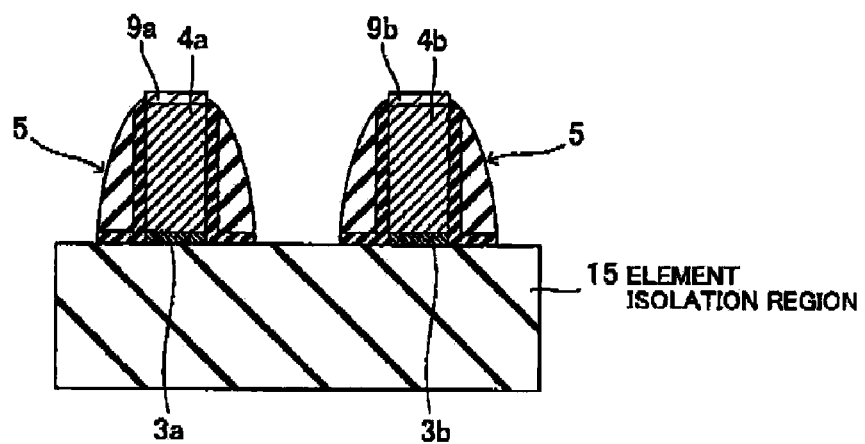

Firstly, as shown in FIGS. 16A and 16B, the processes until the process, shown in FIGS. 4A and 4B, for forming the gate suicide layers 9a and 9b are carried out in the same way as the first embodiment.

Figure 17A:
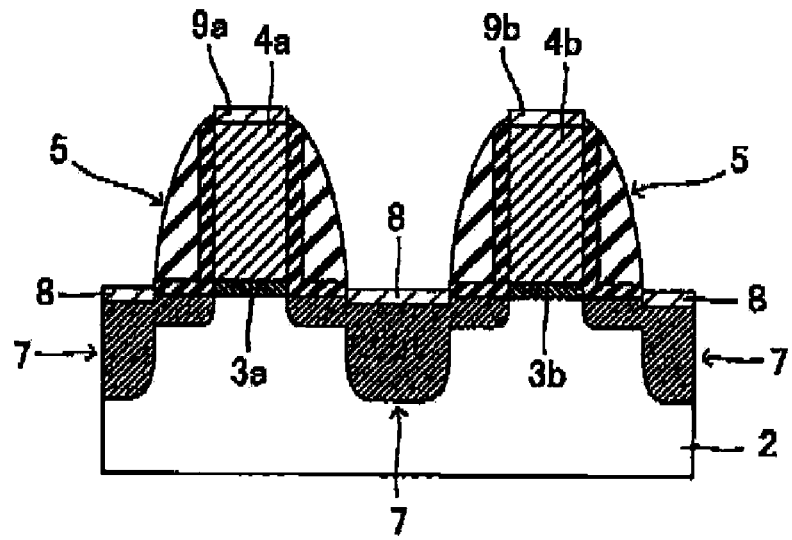
FIGS. 17A and 17B are cross sectional views showing processes for fabricating the semiconductor device according to the fourth embodiment.
Figure 17B:
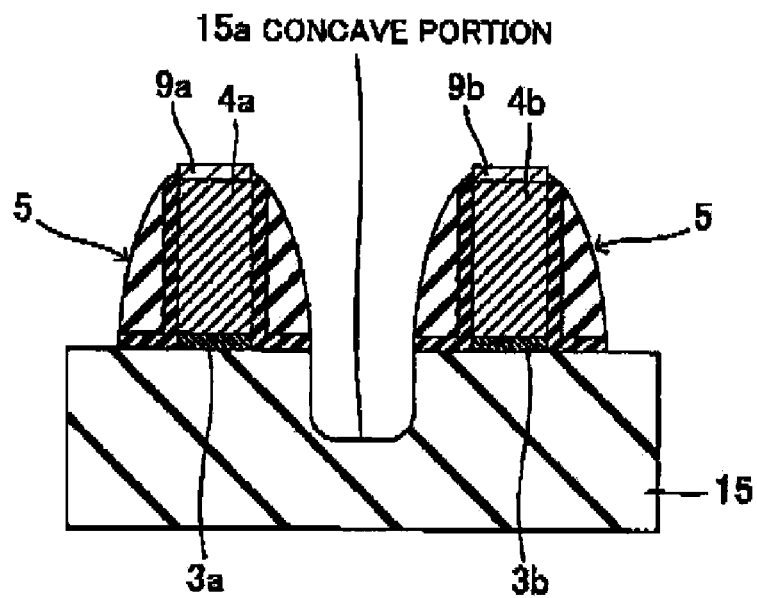

Next, as shown in FIGS. 17A and 17B, a region of the element isolation region 15 between the gate electrodes 4a and 4b (between the gate sidewalls 5 facing each other) is etched by a RIE (Reactive Ion Etching) method or a wet etching method, which results in that the concave portion 15a is formed.

Figure 18A:
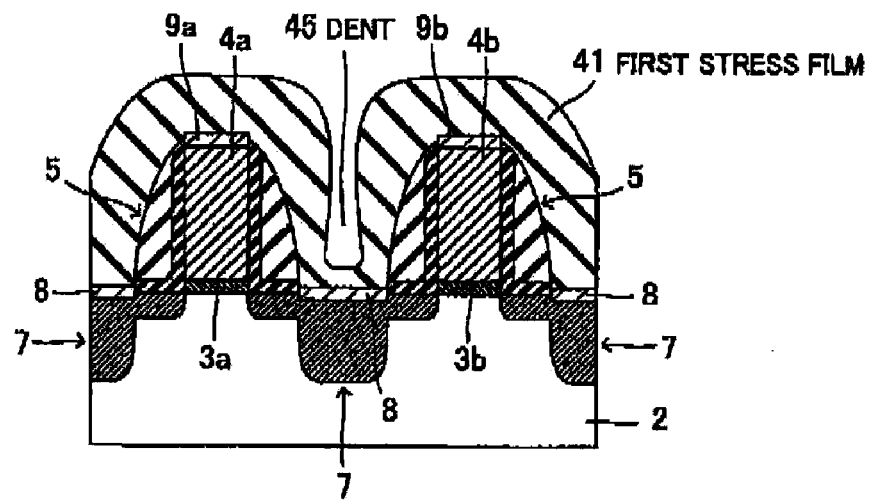
FIGS. 18A and 18B are cross sectional views showing processes for fabricating the semiconductor device according to the fourth embodiment.
Figure 18B:
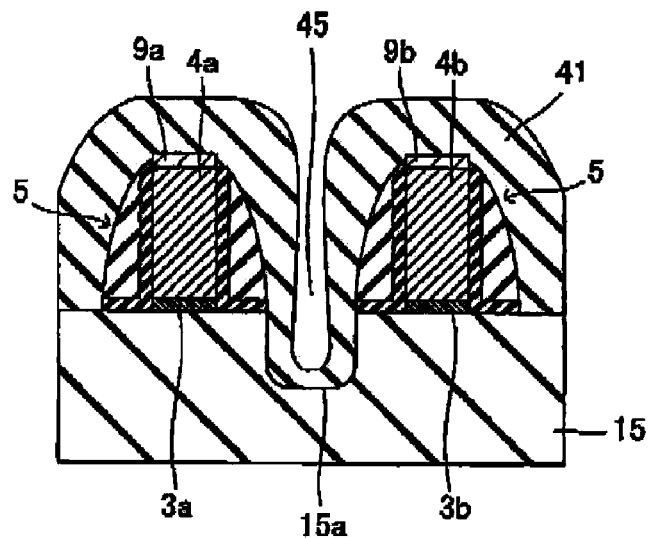

Next, as shown in FIGS. 18A and 18B, a first stress film 41 is formed so as to cover the whole surface of the semiconductor substrate 2 by the plasma CVD method, etc., using $SiH_4$ and $NH_3$ as a source gas. At this time, a portion of the first stress film 41 located between the gate electrodes 4a and 4b becomes uneven in thickness due to the distance between the gate electrodes 4a and 4b (the distance between the gate sidewalls 5 facing each other) or the coatability of the first stress film 41, etc., and a narrow dent 45 is thus formed. At this time, the dent 45 in a region on the element isolation region 15 is formed to a position deeper than a position of the dent 45 in a region on the source/drain region 7 due to the concave portion 15a.

Figure 19A:
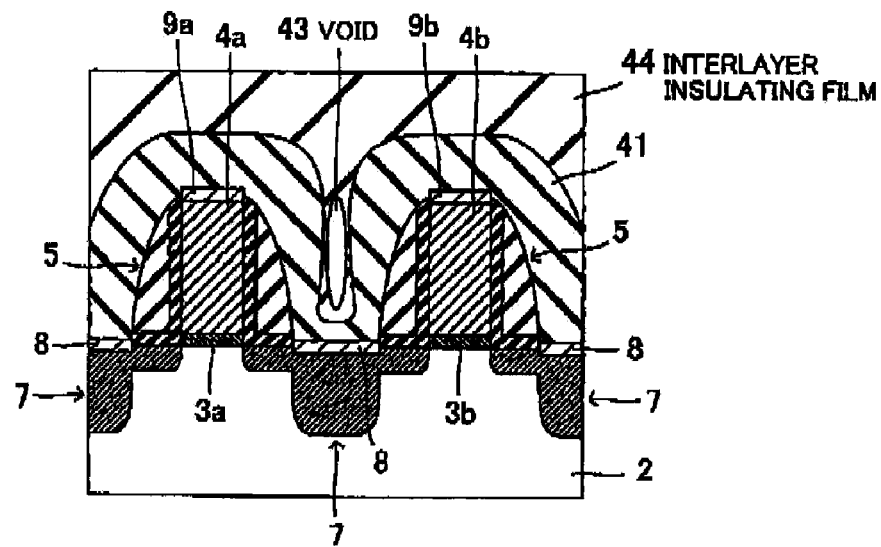
FIGS. 19A and 19B are cross sectional views showing processes for fabricating the semiconductor device according to the fourth embodiment.
Figure 19B:
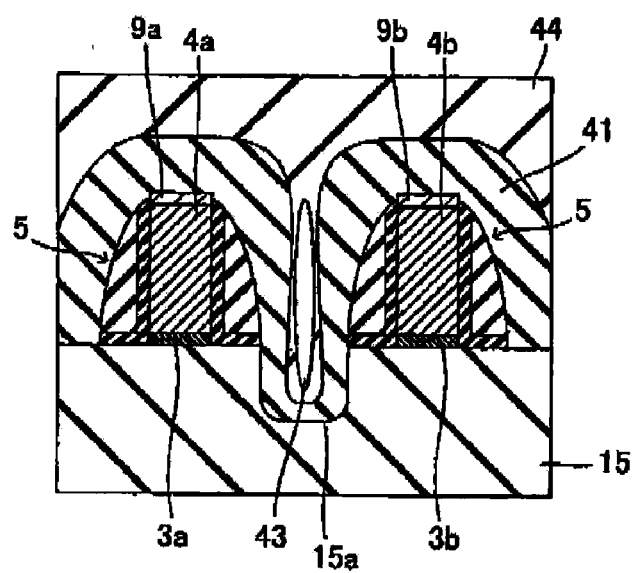

Next, as shown in FIGS. 19A and 19B, an interlayer insulating film 44 is formed on the first stress film 41 by the CVD method, etc. At this time, the interlayer insulating film 44 is not completely embedded in the dent 45 due to the shape and size of the dent 45 or the coatability of the interlayer insulating film 44, etc., and a void 43 is thus formed. At this time, in the region on the element isolation region 15, since the dent 45 is formed to a deep position and an aspect ratio (depth/width) of the dent 45 is larger than that in the region on the source/drain region 7, the interlayer insulating film 44 is more unlikely to be embedded into the dent 45. As a result, the void 43 larger than that in the region on the source/drain region 7 is formed in the region on the element isolation region 15.

Next, the semiconductor device 40 shown in FIGS. 15A and 15B is obtained by forming the second stress film 42, the contacts 13 and the dummy contacts 14 in the same way as the first embodiment.

Note that, in the present embodiment, since the void 43 is particularly large in the region on the element isolation region 15, it is preferable to form contact holes also on the element isolation region 15 in order to effectively form the second stress film 42 in the void 43. Namely, the semiconductor device 40 preferably has the dummy contact 14.

According to the fourth embodiment, since it is possible to increase a region occupied by the second stress film 42 in the region on the element isolation region 15, it is possible to generate a strain in the channel regions 6a and 6b more effectively.

Furthermore, since the first stress film 41 is, or the first stress film 41 and the second stress film 42 are formed to a position lower than an interface between the semiconductor substrate 2 and the gate insulating films 3a and 3b, it is possible to generate a strain in the channel regions 6a and 6b more effectively by applying a force to the channel regions 6a and 6b also from a direction parallel to the surface of the semiconductor substrate 2.

Note that, in the above-mentioned present embodiment, although it is explained that the second stress film 42 is formed in the void 43 that is formed in the interlayer insulating film 44 in the same way as the first embodiment, a portion of or the entire second stress film 42 may be formed in a void that is formed in the first stress film 41 in the same way as the third embodiment.

Fifth Embodiment

The fifth embodiment is different from the first embodiment in a shape of a second stress film, etc. Note that, the explanation will be omitted for the points same as the first embodiment.

Figure 20A:
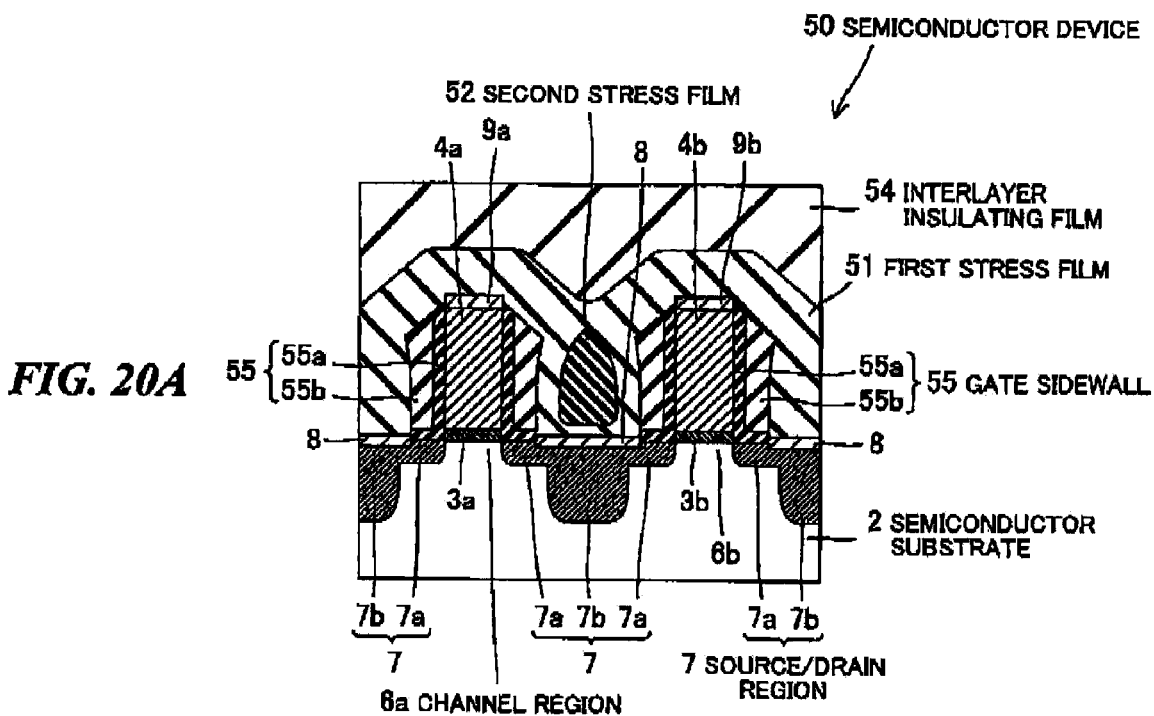
FIGS. 20A and 20B are cross sectional views showing a semiconductor device according to a fifth embodiment.
Figure 20B:
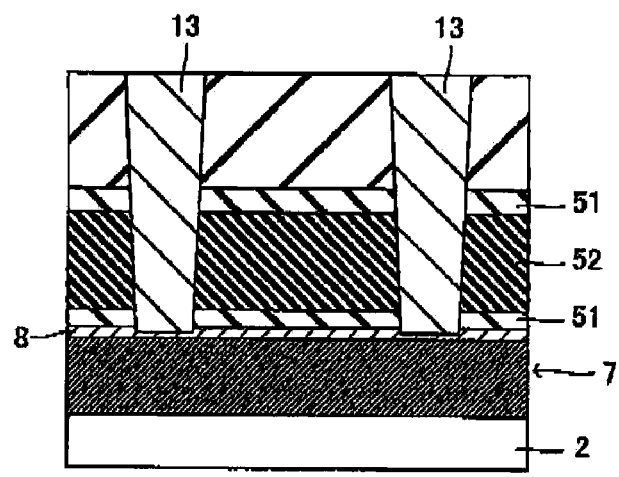

FIGS. 20A and 20B are cross sectional views showing a semiconductor device according to a fifth embodiment. Note that, the cross sections shown in FIGS. 20A and 20B each correspond to the cross sections shown in FIGS. 2A and 2B in the first embodiment.

In a semiconductor device 50 according to the present embodiment, gate sidewalls 55 on side faces of the gate electrodes 4a and 4b have a shape that side faces thereof are formed with an angle nearly orthogonal to the semiconductor substrate 2. Therefore, a width of a void 53 formed in a first stress film 51 is increased and volume of a second stress film 52 formed in the void 53 is also increased. Note that, the materials and functions of the first stress film 51 and the second stress film 52 are same as those in the first embodiment, which is to generate a crystal strain in the channel regions 6a and 6b.

An example of a method of fabricating a semiconductor device 50 according to the present embodiment will be described hereinafter.

FIGS. 21A, 22A, 23A and 24A are cross sectional views showing processes for fabricating the semiconductor device according to the fifth embodiment, and the cross sections thereof correspond to the cross section shown in FIG. 20A. Furthermore, FIGS. 21B, 22B, 23B and 24B are cross sectional views showing processes for fabricating the semiconductor device according to the fifth embodiment, and the cross sections thereof correspond to the cross section shown in FIG. 20B.

Firstly, the processes until the process, shown in FIGS. 3A and 3B, for forming the extension region 7a of the source/drain region 7 are carried out in the same way as the first embodiment.

Figure 21A:
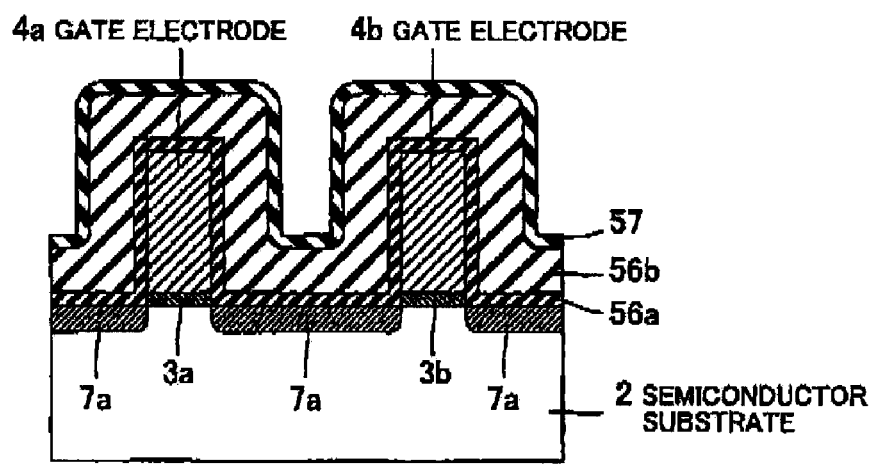
FIGS. 21A and 21B are cross sectional views showing processes for fabricating the semiconductor device according to the fifth embodiment.
Figure 21B:
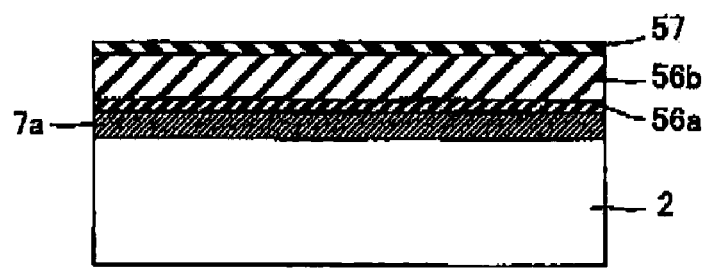

Next, as shown in FIGS. 21A and 21B, insulating films 56a, 56b and 57 are laminated on the whole surface of the semiconductor substrate 2 by the CVD method, etc. Here, the insulating films 56a and 56b are films which are processed into a first layer 55a and a second layer 55b of the gate sidewall 55 in a posterior process. In addition, the insulating film 57 is made of an Si oxide film, etc., formed by ashing or the CVD method, and is used for shaping the insulating films 56a and 56b into the gate sidewall 55 of which side face is formed with an angle nearly orthogonal to the semiconductor substrate 2.

Figure 22A:
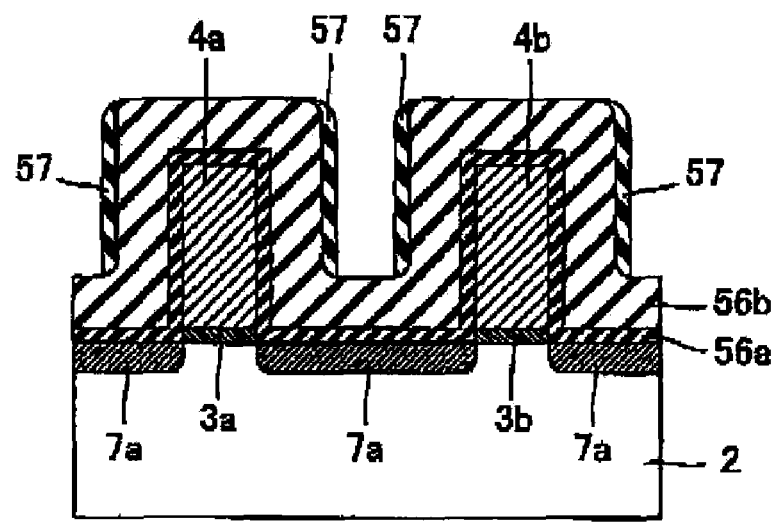
FIGS. 22A and 22B are cross sectional views showing processes for fabricating the semiconductor device according to the fifth embodiment.
Figure 22B:
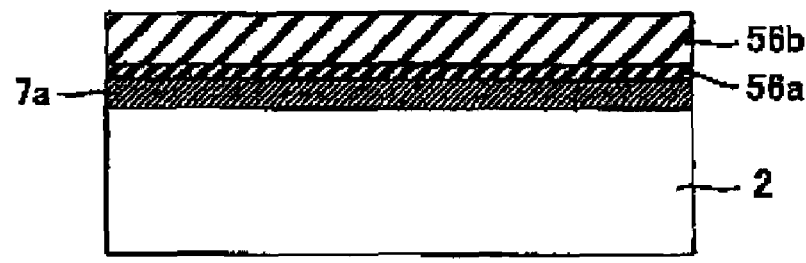

Next, as shown in FIGS. 22A and 22B, anisotropic etching is applied in a direction substantially orthogonal to the surface of the semiconductor substrate 2 by the RIE method, etc. As a result, a portion of the insulating film 57 located on the upper surface of the insulating film 56b is removed and a portion of the insulating film 57 located on the side face of the insulating film 56b is left. Note that, it is preferable to switch to an isotropic etching condition, in which an etching selectivity of the insulating film 57 to the insulating film 56b is ensured, before completely removing the portion of the insulating film 57 located on the upper surface of the insulating film 56b.

Figure 23A:
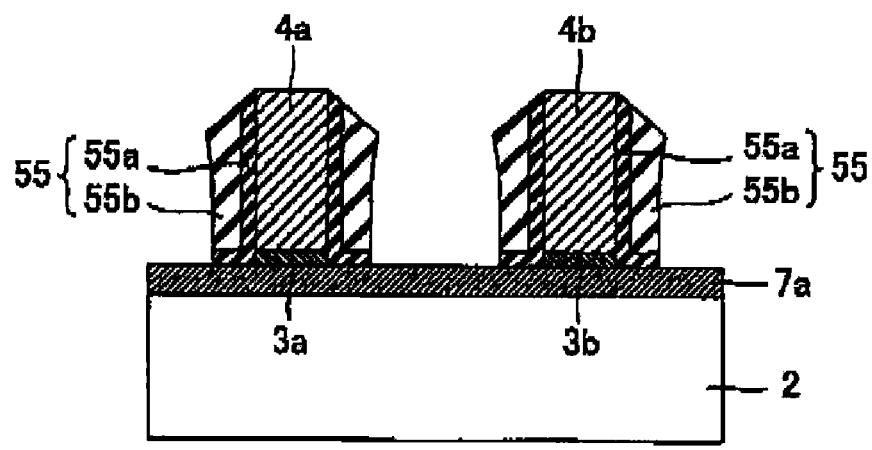
FIGS. 23A and 23B are cross sectional views showing processes for fabricating the semiconductor device according to the fifth embodiment.
Figure 23B:

As shown in FIGS. 23A and 23B, the anisotropic etching in a direction substantially orthogonal to the surface of the semiconductor substrate 2 is further continued for shaping the insulating films 56a and 56b into the first layer 55a and the second layer 55b of the gate sidewall 55. At this time, since the insulating film 57 left on the side face of the insulating film 56b protects the side face of the insulating film 56b until the insulating film 57 is removed, the gate sidewall 55 having the side face formed with the angle substantially orthogonal to the semiconductor substrate 2 is formed.

Figure 24A:
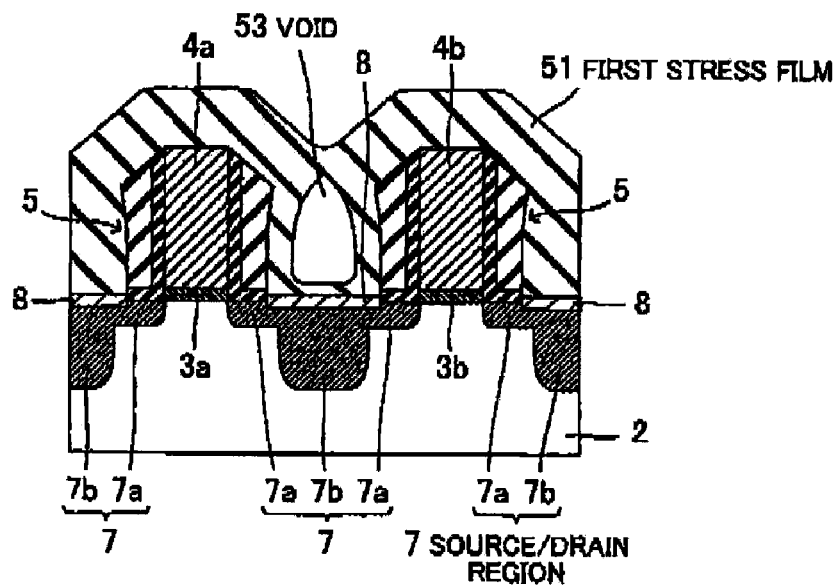
FIGS. 24A and 24B are cross sectional views showing processes for fabricating the semiconductor device according to the fifth embodiment.
Figure 24B:
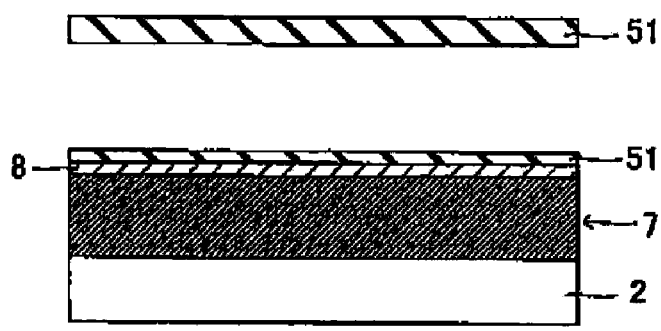

Next, as shown in FIGS. 24A and 24B, the first stress film 51 is formed so as to cover the whole surface of the semiconductor substrate 2 by the plasma CVD method, etc., using $SiH_4$ and $NH_3$ as a source gas. At this time, the first stress film 51 is not formed in uniform thickness in a region between the gate electrodes 4a and 4b due to the distance between the gate electrodes 4a and 4b (the distance between the gate sidewalls 5 facing each other) or the coatability of the first stress film 51, etc., and the void 53 is thus formed. The upper portion of the void 53 is blocked off by the first stress film 51.

Next, the semiconductor device 50 shown in FIGS. 20A and 20B is obtained by forming an interlayer insulating film 54, the second stress film 52, the contacts 13 and the dummy contacts (not shown) in the same way as the first embodiment.

According to the fifth embodiment, it is possible to enlarge the void 53 by forming the gate sidewall 55 so that the side face thereof has an angle nearly orthogonal to the semiconductor substrate 2. As a result, it is possible to increase a region occupied by the second stress film 52 formed in the void 53, thereby generating a strain in the channel regions 6a and 6b more effectively.

Note that, in the above-mentioned present embodiment, although it is explained that the second stress film 52 is formed in the void 53 that is formed in the first stress film 51 in the same way as the third embodiment, a portion of or the entire second stress film 52 may be formed in the void that is formed in the interlayer insulating film 54 in the same way as the first embodiment.

Sixth Embodiment

The sixth embodiment is a case of separately forming stress films in the n-type transistor region and the p-type transistor region. Note that, the explanation will be omitted for the points same as the first embodiment.

Figure 25A:
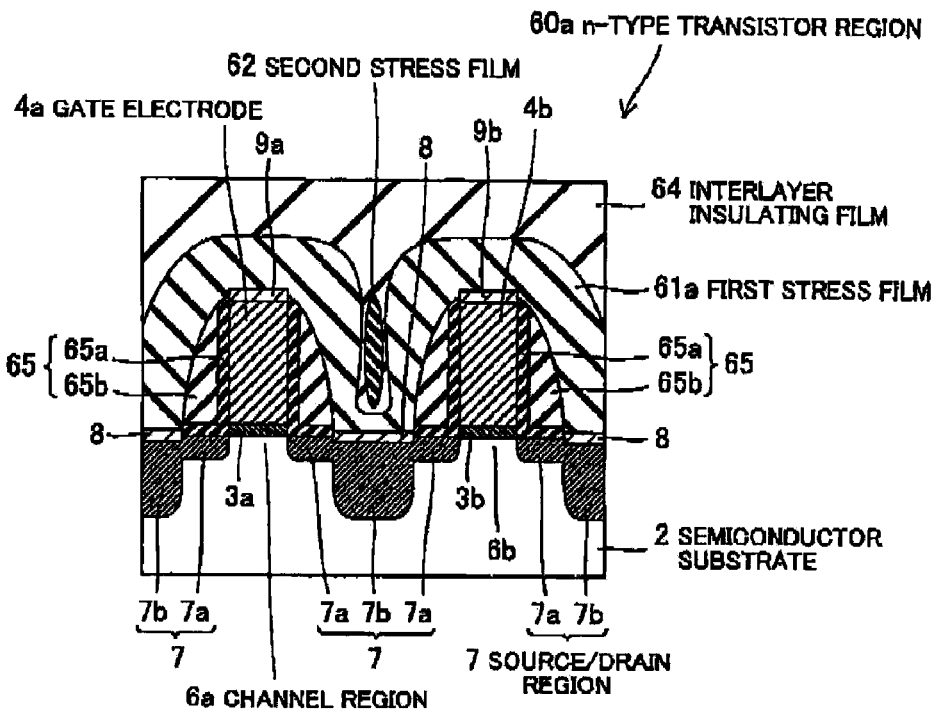
FIGS. 25A and 25B are cross sectional views showing p-type and n-type transistor regions of a semiconductor device according to a sixth embodiment.
Figure 25B:
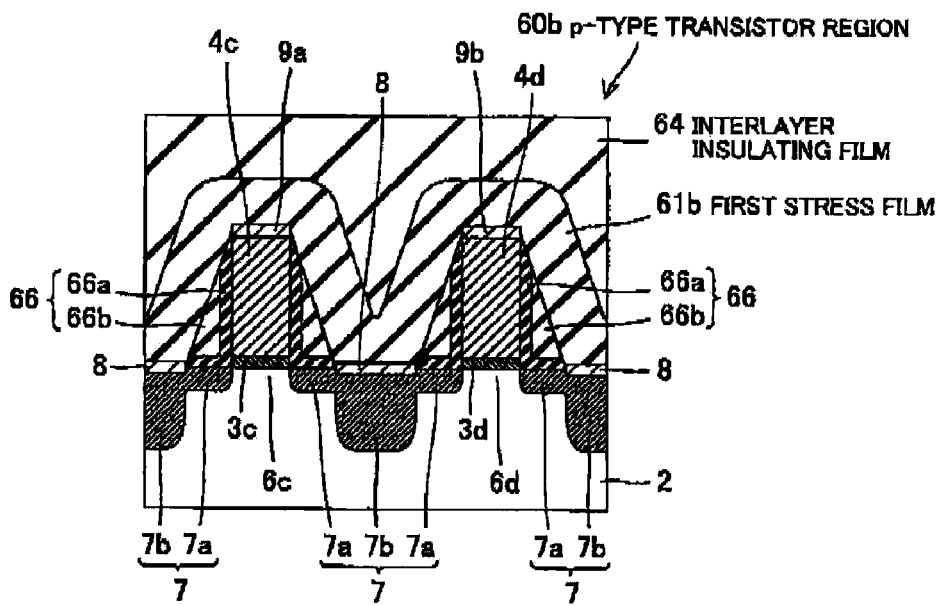

FIGS. 25A and 25B are cross sectional views showing n-type and p-type transistor regions of a semiconductor device according to a sixth embodiment. Note that, the cross sections shown in FIGS. 25A and 25B each correspond to the cross section shown in FIG. 2A in the first embodiment.

A semiconductor device in the present embodiment has a structure in which a second stress film 62 for generating a compressive strain in the channel regions 6a and 6b is included in an n-type transistor region 60a and a second stress film is not included in a p-type transistor region 60b. Here, in the p-type transistor region 60b, a distance between gate electrodes 4c and 4d (a distance between gate sidewalls 66 facing each other) is increased by forming the gate sidewalls 66 in a taper shape without roundness. As a result, a void is not formed in an interlayer insulating film 64. On the other hand, the n-type transistor region 60a has the same structure as that of a transistor region of the semiconductor device 1 shown in the first embodiment, and the shape of a gate sidewall 65 is same as the gate sidewall 5 in the first embodiment.

In addition, the first stress film is separately formed as a first stress film 61a in the n-type transistor region 60a for generating a tensile strain in the channel regions 6a and 6b and as a first stress film 61*b* in the p-type transistor region 60*b* for generating a compressive strain in channel regions 6*c* and 6*d*.

An example of a method of fabricating a semiconductor device according to the present embodiment will be described hereinafter.

FIGS. 26A, 27A, 28A and 29A are cross sectional views showing processes for fabricating the semiconductor device according to the sixth embodiment, and the cross sections thereof correspond to the cross section shown in FIG. 25A. Furthermore, FIGS. 26B, 27B, 28B and 29B are cross sectional views showing processes for fabricating the semiconductor device according to the sixth embodiment, and the cross sections thereof correspond to the cross section shown in FIG. 25B.

Figure 26A:
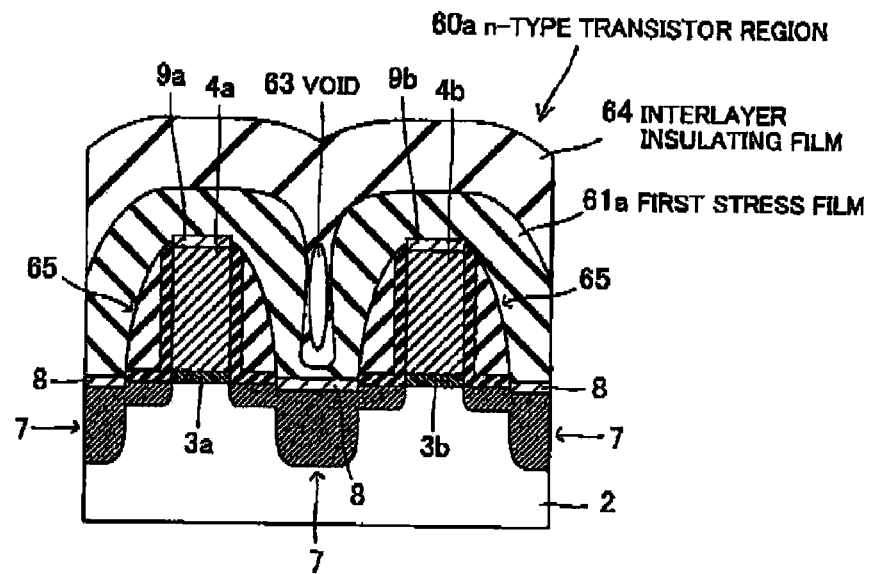
FIGS. 26A and 26B are cross sectional views showing processes for fabricating the semiconductor device according to the sixth embodiment.
Figure 26B:
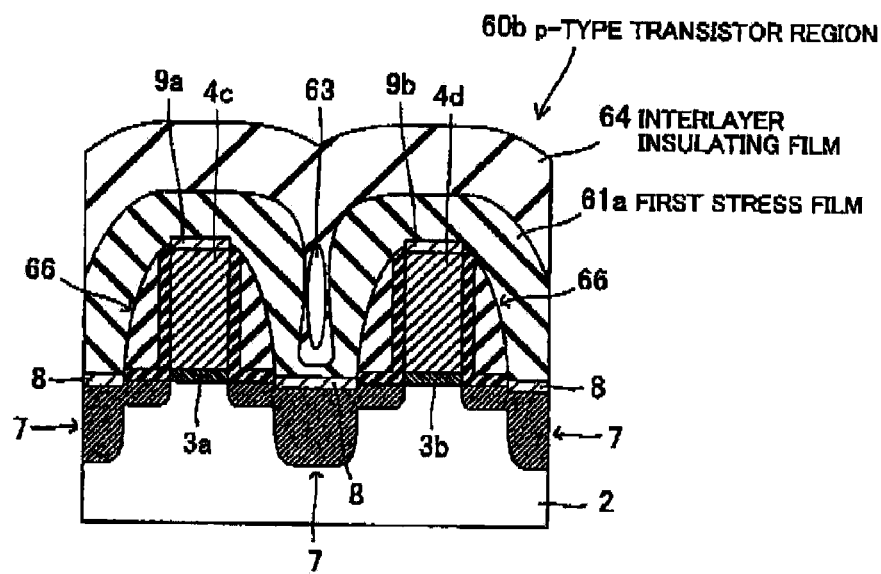

Firstly, as shown in FIGS. 26A and 26B, the processes until the process, shown in FIGS. 6A and 6B, for forming the interlayer insulating film 64 are carried out in the same way as the first embodiment. In detail, the interlayer insulating film 64 including the first stress film 61*a* as well as a void 63 is formed in both of the n-type transistor region 60*a* and the p-type transistor region 60*b*.

Figure 27A:
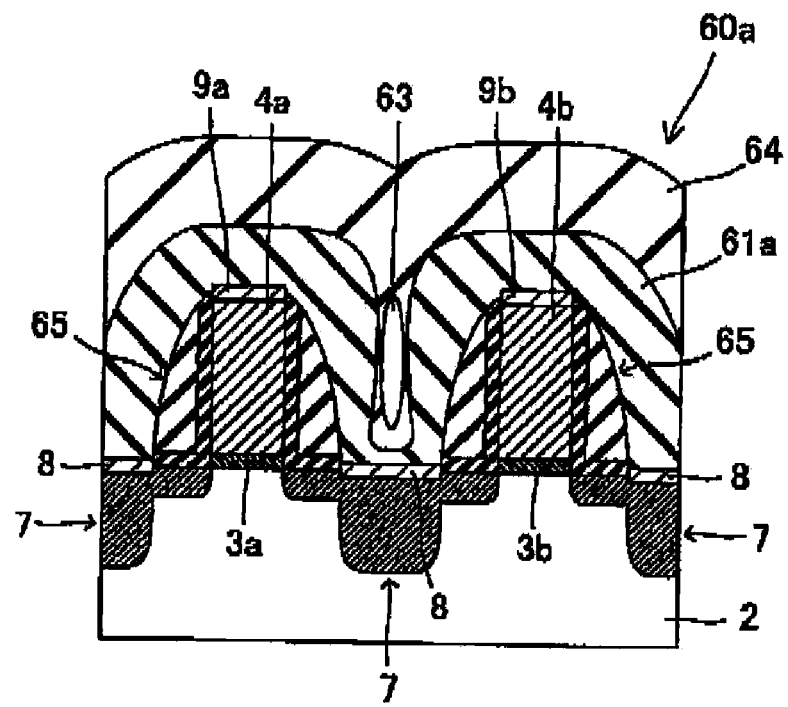
FIGS. 27A and 27B are cross sectional views showing processes for fabricating the semiconductor device according to the sixth embodiment.
Figure 27B:
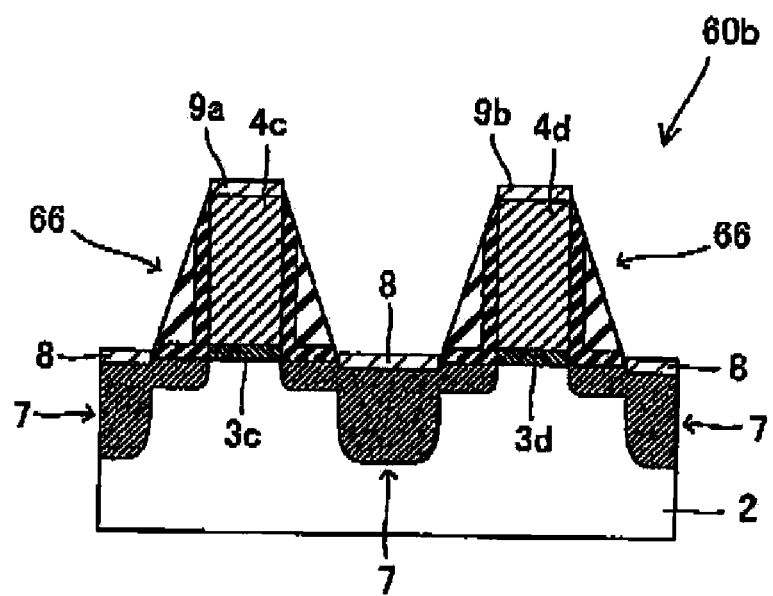

Next, as shown in FIGS. 27A and 27B, the first stress film 61*a* and the interlayer insulating film 64 in the p-type transistor region 60*b* are selectively removed by the lithography method and the RIE method, etc., and the gate sidewalls 66 is shaped into a taper shape. Here, the gate sidewalls 66 is shaped into the taper shape by, e.g., applying the anisotropic etching to the first stress film 61*a* and the interlayer insulating film 64 at the same time.

Figure 28A:
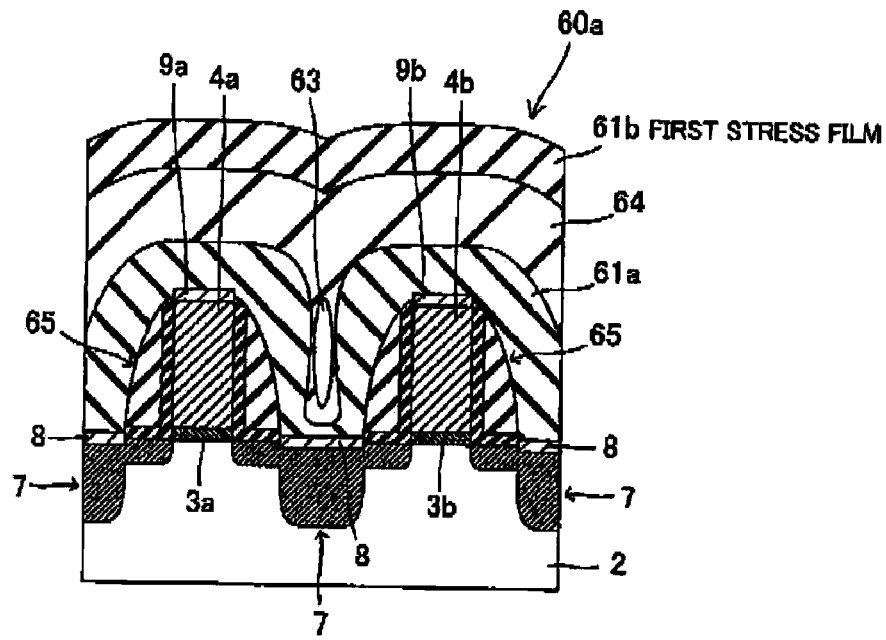
FIGS. 28A and 28B are cross sectional views showing processes for fabricating the semiconductor device according to the sixth embodiment.
Figure 28B:
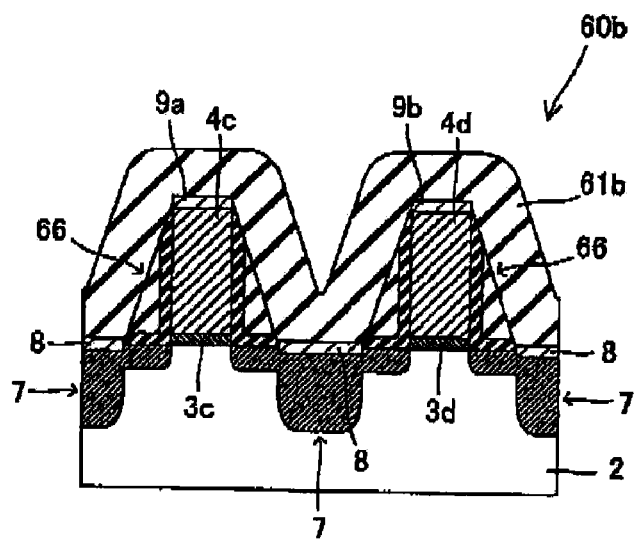

Next, as shown in FIGS. 28A and 28B, the first stress film 61*b* is formed so as to cover the whole surface of the semiconductor substrate 2 by the plasma CVD method, etc., using SiH$_4$ and NH$_3$ as a source gas. At this time, the first stress film 61*b* is formed on the interlayer insulating film 64 in the n-type transistor region 60*a*, and is formed on the gate electrodes 4*c*, 4*d* and the gate sidewalls 66 in the p-type transistor region 60*b*. Here, since the gate sidewall 66 has a taper shape, the distance between the gate electrodes 4*c* and 4*d* (the distance between gate sidewalls 66 facing each other) is large, thus, the first stress film 61*b* is formed in uniform thickness also in a region between the gate electrodes 4*c* and 4*d*.

Figure 29A:
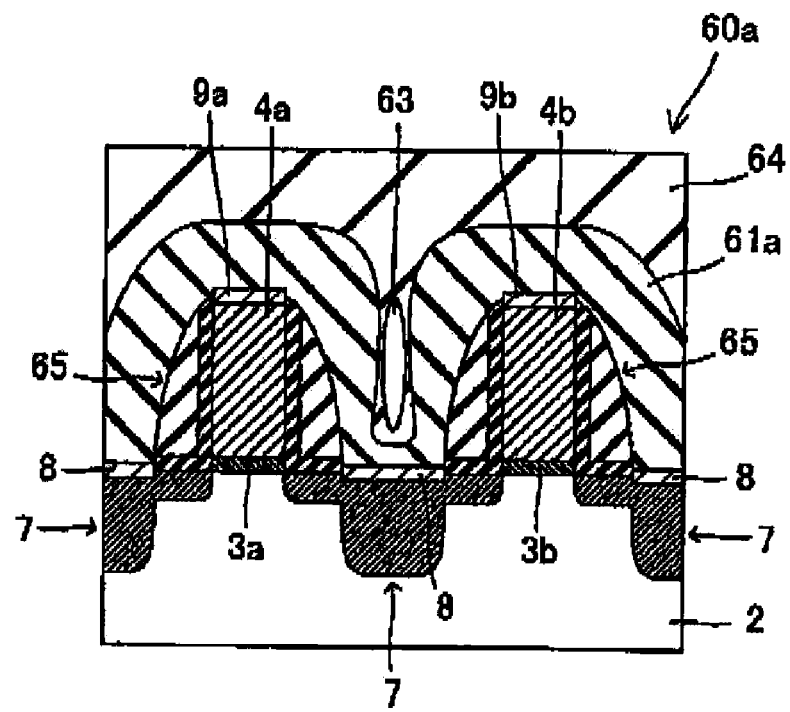
FIGS. 29A and 29B are cross sectional views showing processes for fabricating the semiconductor device according to the sixth embodiment.
Figure 29B:
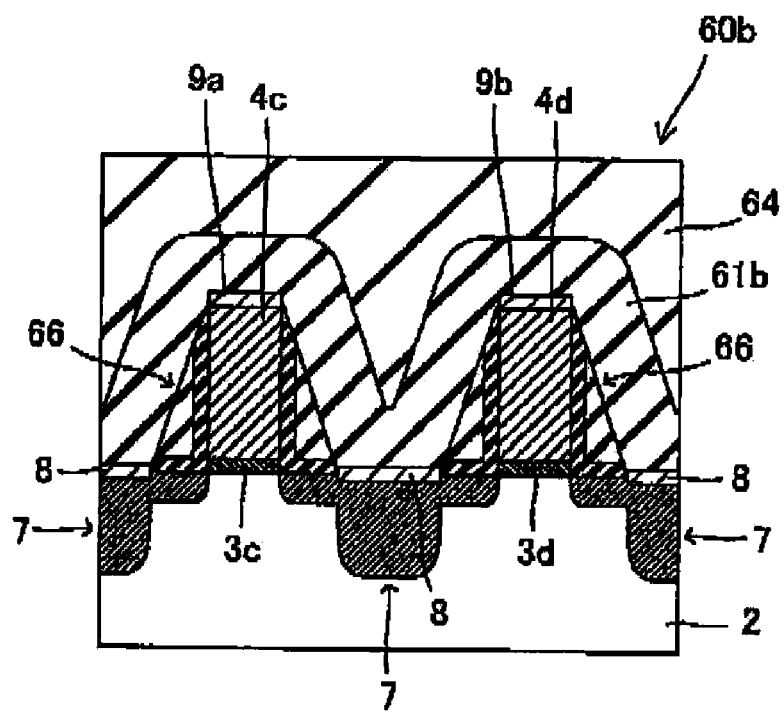

Next, as shown in FIGS. 29A and 29B, the first stress film 61*b* in the n-type transistor region 60*a* is selectively removed by the lithography method and the RIE method, etc. and then, the interlayer insulating film 64 is formed on the whole surface of the semiconductor substrate by the CVD method, etc. At this time, the interlayer insulating film 64 is formed on the interlayer insulating film 64 which has been already formed in the n-type transistor region 60*a*, and is formed on the first stress film 61*b* in the p-type transistor region 60*b*. Here, since the first stress film 61*b* is formed in substantially uniform thickness also in the region between the gate electrodes 4*c* and 4*d*, a void is not formed in the interlayer insulating film 64.

Next, height of the interlayer insulating film 64 is equalized by planarizing the upper surface thereof, and the second stress film 62, the contacts 13 and the dummy contacts (not shown) are formed in the same way as the first embodiment, thereby obtaining the semiconductor device shown in FIGS. 25A and 25B.

According to the sixth embodiment, the second stress film 62 can be formed only in the n-type transistor region 60*a* by forming the gate sidewalls 66 of p-type transistor region 60*b* in the taper shape, and even when a stress generated in the peripheral members by the second stress film 62 adversely affects the carrier mobility in the channel regions 6*c* and 6*d* of the p-type transistor region 60*b*, it is possible to improve the carrier mobility in the channel regions 6*a* and 6*b* of the n-type transistor region 60*a* without lowering that in the channel regions 6*c* and 6*d*.

Alternatively, the structures of the n-type transistor region 60*a* and the p-type transistor region 60*b* may be reversed. In such a case, the second stress film is formed in the channel regions 6*c* and 6*d* of the p-type transistor region 60*b*.

Furthermore, in the above-mentioned present embodiment, although it is explained that the second stress film 62 is formed in the void 63 that is formed in the interlayer insulating film 64 in the same way as the first embodiment, a portion of or the entire second stress film 62 may be formed in a void that is formed in the first stress film 61*a* in the same way as the third embodiment.

Other Embodiments

It should be noted that the present invention is not intended to be limited to the above-mentioned first to third embodiments, and the various kinds of changes thereof can be implemented by those skilled in the art without departing from the gist of the invention.

Furthermore, it is possible to arbitrarily combine the configurations of the above-mentioned first to fourth embodiments without departing from the gist of the invention.

What is claimed:

1. A semiconductor device, comprising:
   a semiconductor substrate comprising an element isolation region;
   first and second gate electrodes formed in substantially parallel on the semiconductor substrate via respective gate insulating films;
   first and second channel regions respectively formed in regions of the semiconductor substrate under the first and second gate electrodes;
   a source/drain region formed in a region of the semiconductor substrate sandwiching the first and second channel regions;
   a first stress film formed so as to cover the semiconductor substrate and the first and second gate electrodes; and
   a second stress film formed in at least a portion of a void, the void being formed in a region between the first and second gate electrodes, the void being formed in the first stress film or in an interlayer insulating film formed on the first stress film.

2. The semiconductor device according to claim 1, wherein the element isolation region comprises concave portions in regions between the first and second gate electrodes; and
   at least a portion of the first stress film is formed in the concave portions above the element isolation region.

3. The semiconductor device according to claim 1, wherein first and second gate sidewalls are respectively formed on side faces of the first and second gate electrodes; and
   the first stress film is formed so as to cover the semiconductor substrate, the first and second gate electrodes and the first and second gate sidewalls.

4. The semiconductor device according to claim 3, wherein an angle of the side faces of the first and second gate sidewalls is substantially orthogonal to a surface of the semiconductor substrate.

5. The semiconductor device according to claim 1, wherein a contact penetrating through the void is formed on the source/drain region, the contact connecting an upper wiring with the source/drain region.

6. The semiconductor device according to claim 1, wherein a dummy contact penetrating through the void is formed on the element isolation region.

7. The semiconductor device according to claim 2, wherein a dummy contact penetrating through the void is formed on one of the concave portions in the element isolation region.

8. The semiconductor device according to claim 1, wherein the first and second gate electrodes, the first and second channel regions and the source/drain region constitute an n-type transistor; and
    the first and second stress films include a stress for generating a tensile stress in a channel direction in the first and second channel regions.

9. The semiconductor device according to claim 1, wherein the source/drain region between the first and second gate electrodes is shared by transistors each composed of the first and second gate electrodes.

10. The semiconductor device according to claim 1, comprising a SRAM structure formed on the semiconductor substrate and comprising the first and second gate electrodes, the first and second channel regions, the source/drain region and the first and second stress films.

11. The semiconductor device according to claim 1, wherein the source drain region is a first source/drain region, the semiconductor device further comprising:
    the first and second gate electrodes formed on the semiconductor substrate in an n-type transistor region;
    first and second gate sidewalls respectively formed on side faces of the first and second gate electrodes;
    the first and second channel regions formed in the n-type transistor region;
    the first source/drain region formed in the n-type transistor region;
    the first stress film formed so as to cover the semiconductor substrate and the first and second gate electrodes in the n-type transistor region, and including a stress for generating a tensile stress in a channel direction in the first and second channel regions;
    the second stress film formed in the n-type transistor region and including a stress for generating a tensile stress in the channel direction in the first and second channel regions;
    third and fourth gate electrodes formed in substantially parallel on the semiconductor substrate in a p-type transistor region via respective gate insulating films;
    third and fourth gate sidewalls having a taper shape formed on side faces of the third and fourth gate electrodes;
    third and fourth channel regions respectively formed in regions of the semiconductor substrate under the third and fourth gate electrodes in the p-type transistor region;
    a second source/drain region formed in a region of the semiconductor substrate sandwiching the third and fourth channel regions in the p-type transistor region; and
    a third stress film formed so as to cover the semiconductor substrate and the third and fourth gate electrodes in the p-type transistor region, and including a stress for generating a compressive stress in a channel direction in the third and fourth channel regions.

12. A method of fabricating a semiconductor device, comprising:
    forming two gate electrodes in substantially parallel on a semiconductor substrate via respective gate insulating films;
    forming a source/drain region in the semiconductor substrate on both sides of the two gate electrodes;
    forming a first stress film on the semiconductor substrate and the two gate electrodes;
    forming an interlayer insulating film on the first stress film;
    forming a contact hole in the first stress film and the interlayer insulating film on the source/drain region so as to penetrate through a void, the void being in the first stress film or the interlayer insulating film in a region between the two gate electrodes; and
    forming a second stress film in at least a portion of the void via the contact hole.

13. The method of fabricating a semiconductor device according to claim 12, wherein the first stress film is formed by a plasma CVD method.

14. The method of fabricating a semiconductor device according to claim 12, wherein the interlayer insulating film is formed by a CVD method using TEOS.

15. The method of fabricating a semiconductor device according to claim 12, wherein the second stress film is formed by a LPCVD method.

16. The method of fabricating a semiconductor device according to claim 12, wherein gate sidewalls are each formed on the side faces of the two gate electrodes; and
    a first stress film is formed on the semiconductor substrate, the two gate electrodes and the gate sidewalls.

17. The method of fabricating a semiconductor device according to claim 12, wherein a dummy contact hole is formed together with the contact hole in the first stress film and the interlayer insulating film on an element isolation region in the semiconductor substrate so as to penetrate through a void in the first stress film or the interlayer insulating film in a region between the two gate electrodes; and
    the second stress film is formed in at least a portion of the void via the contact hole and the dummy contact hole.

18. The method of fabricating a semiconductor device according to claim 12, wherein a concave portion is formed by etching a region between the two gate electrodes in the element isolation region in the semiconductor substrate; and
    the first stress film is formed on the semiconductor substrate, the concave portion of the element isolation region and the two gate electrodes.

19. The method of fabricating a semiconductor device according to claim 12, wherein a first insulating film and a second insulating film are deposited on the semiconductor substrate and the two gate electrodes after forming the source/drain region, a portion of the second insulating film located on an upper surface of the first insulating film is removed by etching, then, an anisotropic etching process in a direction substantially orthogonal to a surface of the semiconductor substrate is applied to the first and second insulating films, thereby forming the first insulating film shaped into gate sidewalls on side faces of the two gate electrodes, the gate sidewalls having side faces formed with an angle substantially orthogonal to the surface of the semiconductor substrate; and
    the first stress film is formed on the semiconductor substrate, the two gate electrodes and the gate sidewalls.

* * * * *